US011287468B2

(12) United States Patent
Shiota et al.

(10) Patent No.: US 11,287,468 B2
(45) Date of Patent: Mar. 29, 2022

(54) ELECTRONIC COMPONENT HANDLING APPARATUS, ELECTRONIC COMPONENT TESTING APPARATUS, AND SOCKET

(71) Applicant: ADVANTEST Corporation, Tokyo (JP)

(72) Inventors: Natsuki Shiota, Tokyo (JP); Aritomo Kikuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/104,749

(22) Filed: Nov. 25, 2020

(65) Prior Publication Data

US 2021/0190856 A1 Jun. 24, 2021

(30) Foreign Application Priority Data

Dec. 24, 2019 (JP) ............................ JP2019-232538

(51) Int. Cl.
*G01R 31/28* (2006.01)
*G01R 29/10* (2006.01)

(52) U.S. Cl.
CPC ....... *G01R 31/2867* (2013.01); *G01R 29/105* (2013.01); *G01R 31/2863* (2013.01); *G01R 31/2875* (2013.01)

(58) Field of Classification Search
CPC ............ G01R 31/2874; G01R 31/2875; G01R 31/2877
See application file for complete search history.

(56) References Cited

U.S. PATENT DOCUMENTS 9,116,232 B2 * 8/2015 Goel ....................... G01S 19/23
2006/0194553 A1 8/2006 Ozaki et al.
2010/0273433 A1 10/2010 Ozaki et al.
2013/0231060 A1 9/2013 Ozaki et al.
2015/0168486 A1 * 6/2015 Isaac ................. G01R 31/2834 324/756.02
2021/0190855 A1 * 6/2021 Shiota ................ G01R 31/2867

FOREIGN PATENT DOCUMENTS

JP 2007-271317 A 10/2007
JP 2008-518567 A 5/2008
JP 2015-094741 A 5/2015

* cited by examiner

*Primary Examiner* — Tung X Nguyen
(74) *Attorney, Agent, or Firm* — Osha Bergman Watanabe & Burton LLP

(57) ABSTRACT

An electronic component handling apparatus includes: a thermostatic chamber in which a socket disposed, the socket electrically being connectable to a device under test (DUT) including a first antenna; a moving device that moves the DUT and presses the DUT against the socket; an anechoic chamber disposed adjacent to the thermostatic chamber; a second antenna disposed inside the thermostatic chamber; and a first window that transmits radio waves radiated from the first or second antenna. The thermostatic chamber has a first opening on a wall surface of the thermostatic chamber. The anechoic chamber has a radio wave absorber and a second opening that opens toward a transmission direction of the radio waves from or to the second antenna. The thermostatic chamber and the anechoic chamber are connected to each other to make the first opening and the second opening face each other.

16 Claims, 16 Drawing Sheets

1
2
20
20a
71
21
40
51
50
52
80
10
53
60
55
90
32
312
311
3
31
VI
VII
VIII
II 32
80
81
82
831
83
20
13
12
10
14
90
91
811
821
822
21
40
53
93
92
50
51
52
55
60

32
20
95
963
97a
12
94
10
91B
14
97
981
98
972
971
96
961
962
963
21
40
53
13
93
92
50
51
52
55
60

20
95
97
13
963
94
12
10
91B
14
32
981
98
972
971
96
961
962
21
40
53
963
94
93
92
50
51
52
55
60

ELECTRONIC COMPONENT HANDLING APPARATUS, ELECTRONIC COMPONENT TESTING APPARATUS, AND SOCKET

CROSS-REFERENCE TO RELATED APPLICATIONS

This application claims priority from Japanese Patent Application No. 2019-232538 filed on Dec. 24, 2019, the contents of which are incorporated herein by reference in their entirety.

BACKGROUND

Technical Field

The present invention relates to the electronic component handling apparatus used in the test of the electronic component under test (DUT: Device Under Test) having an antenna, an electronic component testing apparatus, and a socket.

Description of the Related Art

OTA (Over the Air) test, attaching a wireless device to a mounting mechanism in an anechoic chamber and measuring signals from the wireless device, is known as a method for determining radiation performance characteristics of the wireless device (for example, see in Patent Document 1).

PATENT DOCUMENT

Patent Document 1: JP 2008-518567 A

Unfortunately, the above method may damage the absorber in the anechoic chamber by heat stress and fail to accurately measure the performance of the wireless device.

SUMMARY

One or more embodiments of the present invention provide an electronic component handling apparatus, an electronic component testing apparatus, and a socket capable of performing an OTA test of a DUT having an antenna with high accuracy.

[1] One or more embodiments of the present invention provide an electronic component handling apparatus including a thermostatic chamber which is configured to place a socket therein, the socket is electrically connectable to a DUT having a first antenna, a moving device which is to move the DUT and press the DUT against the socket, an anechoic chamber disposed adjacent to the thermostatic chamber, a second antenna disposed inside the thermostatic chamber, and a first window which is to transmit radio waves radiated from the first or second antenna. The thermostatic chamber comprises a first opening on the wall surface of the thermostatic chamber. The anechoic chamber includes a radio wave absorbing material and a second opening which opens toward the transmission and reception direction of the radio waves of the second antenna. The thermostatic chamber and the anechoic chamber are connected to each other so that the first opening and the second opening face each other.

[2] In one or more embodiments, the first window may include a pair of plate-shaped members (i.e., plate-shaped sheets) which is to transmit radio waves radiated from the first or second antenna and a spacer interposed between the pair of plate-shaped members and determining a space between the pair of plate-shaped members. The electronic component handling apparatus may include a supply device which is to supply dry air to the space.

[3] In one or more embodiments, the electronic component handling apparatus may include a heater to heat the plate-shaped member disposed on the anechoic chamber side among the pair of plate-shaped members.

[4] In one or more embodiments, the moving device may include a holding portion (i.e., holder) to hold the DUT. The holding portion may include a reflector to reflect radio waves radiated from the first and second antennas. The reflector may be inclined with respect to a main surface of the socket.

[5] In one or more embodiments, the reflector may be provided in the holding portion to face the first antenna in the normal direction of the main surface of the socket.

[6] In one or more embodiments, the holding portion may include a touching portion (i.e., pusher) to touch the DUT. The reflector may be held by the touching portion.

[7] In one or more embodiments, the holding portion may include a cylindrical touching portion to touch the DUT to surround the first antenna and a suction device to suck a space in the touching portion. The touching portion may include a third opening in a side wall of the touching portion and a second window which is to transmit radio waves radiated from the first or second antenna. The second window may close the third opening. The reflector may be disposed inside the touching portion to face the second window.

[8] In one or more embodiments, the thermostatic chamber may include one of the thermostatic chambers, a plurality of the radio wave anechoic chambers, and a plurality of the first windows. The thermostatic chamber may have a plurality of the first openings. The thermostatic chamber and a plurality of the radio wave anechoic chambers may be connected so that each of the first openings faces the corresponding second opening of the anechoic chambers. A plurality of the first windows may close a plurality of the first openings, respectively.

[9] In one or more embodiments, the following formula (1) may be satisfied, $$W_1 \geq W_2 \quad (1)$$

In the above equation (1), $W_1$ is the width of the first opening, and $W_2$ is the spread width, in the width direction of the first opening, of the radio wave when the radio wave radiated from the first antenna and reflected by the reflector reaches the first opening.

[10] One or more embodiments of the present invention provide an electronic component testing apparatus including an electronic component handling apparatus described above, and a tester including a test head to which the socket is mounted. The tester tests the DUT by transmitting and receiving radio waves between the first and second antennas with the DUT electrically connected to the socket and the tester electrically connected to the second antenna.

[11] One or more embodiments of the present invention provide an electronic component testing apparatus including a socket which a DUT having a first antenna is electrically connected to, a tester having a test head which the socket is mounted thereon, a thermostatic chamber which the socket is disposed therein, an anechoic chamber disposed adjacent to the thermostatic chamber, a second antenna disposed inside the anechoic chamber, and a first window which is configured to transmit radio waves radiated from the first or second antenna. The thermostatic chamber includes a first opening on the wall surface of the thermostatic chamber.

The anechoic chamber includes a radio wave absorber disposed on the inner wall of the anechoic chamber and a second opening which opens toward the transmission and reception direction of the radio waves of the second antenna. The thermostatic chamber and the anechoic chamber are connected to each other so that the first opening and the second opening face each other. The first window closes the opening. The socket includes a socket body to hold a contact which is electrically connected to the DUT and a socket cover to cover the socket body and press the DUT against the socket body. The socket cover has a reflector reflecting radio waves radiated from the first or second antenna. The reflector is inclined with respect to the main surface of the socket body. The tester tests the DUT by transmitting and receiving radio waves between the first and second antennas with the DUT electrically connected to the socket and the tester electrically connected to the second antenna.

[12] In one or more embodiments, the first window member may include a pair of plate-shaped members which is configured to transmit radio waves radiated from the first or second antenna and a spacer interposed between the pair of plate-shaped members and determining a space between the pair of plate-shaped members. The electronic component testing apparatus may include a supply device to supply dry air to the space.

[13] In one or more embodiments, the electronic component testing apparatus may include a heater to heat the plate-shaped member disposed on the anechoic chamber side among the pair of plate-shaped members.

[14] One or more embodiments of the present invention provide a socket including a socket body to hold a contactor which is electrically connected to the DUT having a first antenna, and a socket cover to cover the socket body and press the DUT against the socket body. The socket cover has a reflector reflecting radio waves radiated from the first antenna. The reflector is inclined with respect to the main surface of the socket body.

[15] In one or more embodiments, the reflector may be provided on the socket cover to face the first antenna in a normal direction of a main surface of the socket body.

[16] In one or more embodiments, the socket cover may include a touching portion that touches the DUT mounted on the socket body. The reflector may be held by the touching portion.

In one or more embodiments of the present invention, the thermostatic chamber and the anechoic chamber are connected to each other so that the first and second openings face each other, the first window closes the first opening, and the first window can transmit the radio wave radiated from the first antenna of the DUT or the second antenna provided in the anechoic chamber. This structure, on the test under high or cold temperature condition in the thermostatic chamber, protects the radio wave absorber from thermal stress and reduces the damage of the radio wave absorber. This achieves the high accuracy of the OTA test for the DUT with the antenna.

BRIEF DESCRIPTION OF DRAWINGS

FIG. 3A is a diagram showing a state before the contact chuck contacts the DUT, and FIG. 3B is a diagram showing the contact chuck in contact with the DUT.

DETAILED DESCRIPTION

Hereinafter, embodiments of the present invention will be described with reference to the drawings.

The First Embodiment

Figure 1:
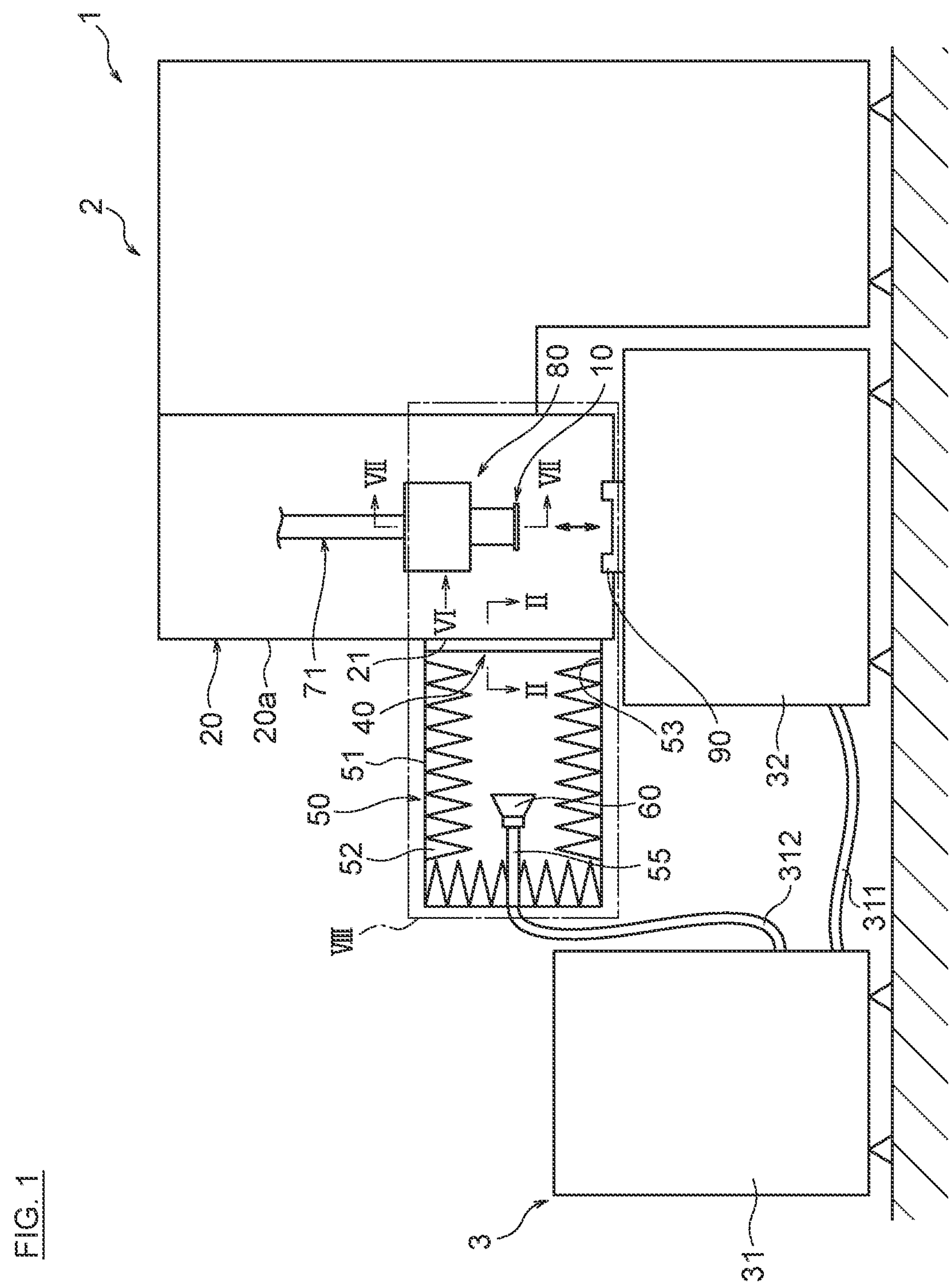
FIG. 1 is a schematic cross-sectional view showing an entire configuration of an electronic component testing apparatus in the first embodiment of the present invention.
Figure 2:
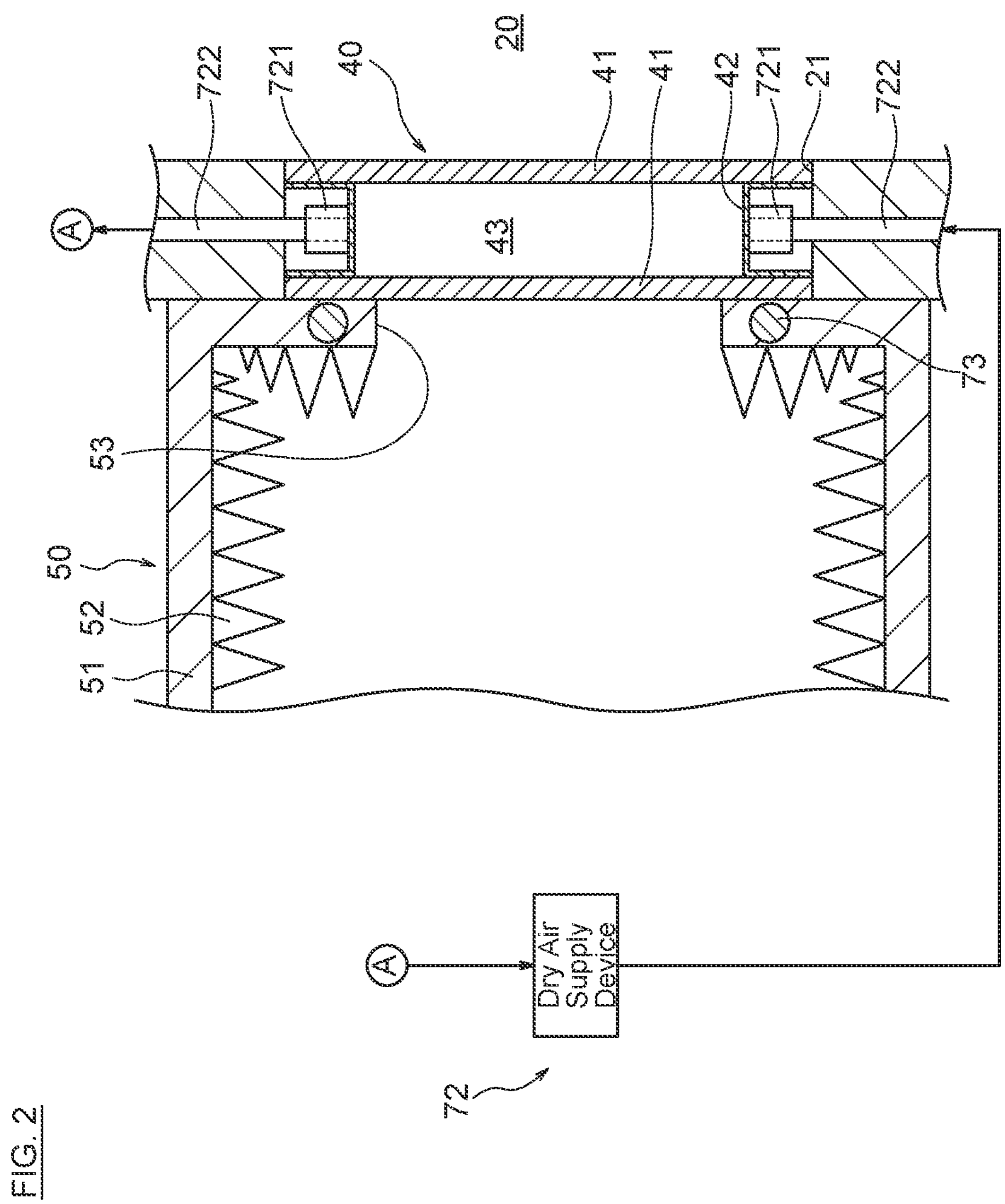
FIG. 2 is an enlarged sectional view taken along II-II of FIG. 1.

FIG. 1 is a schematic sectional view showing the overall configuration of the electronic component testing apparatus in this embodiment, FIG. 2 is an enlarged sectional view taken along II-II of FIG. 1.

The electronic component testing apparatus 1 in this embodiment is an apparatus for performing OTA test of a DUT 10 having a device antenna 12. Specifically, this testing apparatus 1 causes a test antenna 60 (to be described later) to receive a radio wave (so-called millimeter wave) with a frequency of 24.250 to 52.600 GHz radiated from the DUT 10 equipped with a device antenna 12 in a far-field, testing the radio wave radiation characteristics of the DUT 10. This testing apparatus 1 also causes the DUT 10 to receive a millimeter wave radiated from the test antenna 60 in the far-field to test the radio wave reception characteristics of the DUT 10.

Figure 3B:
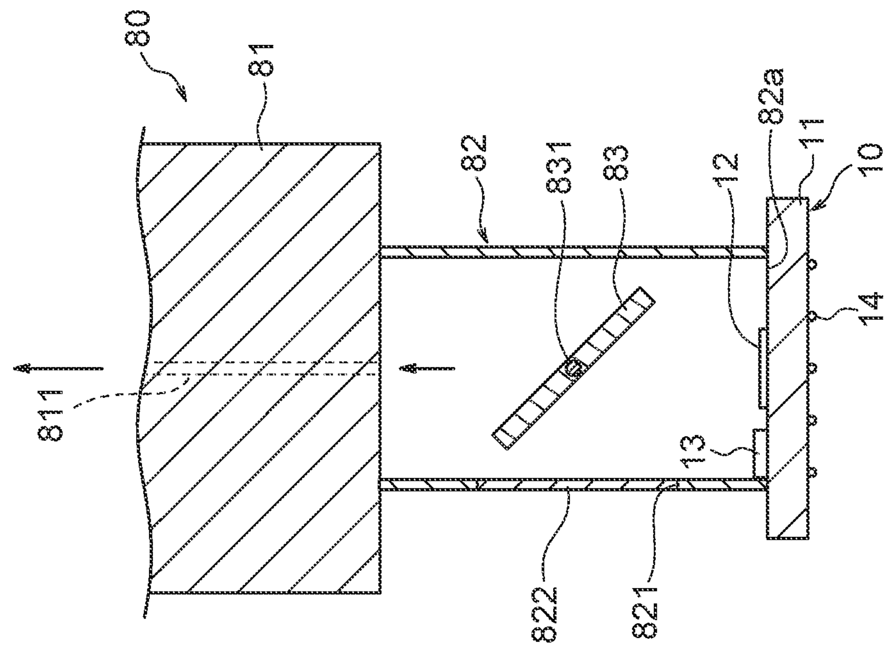
FIGS. 3A and 3B are cross-sectional views each showing a contact chuck in the first embodiment of the present invention.
Figure 3A:
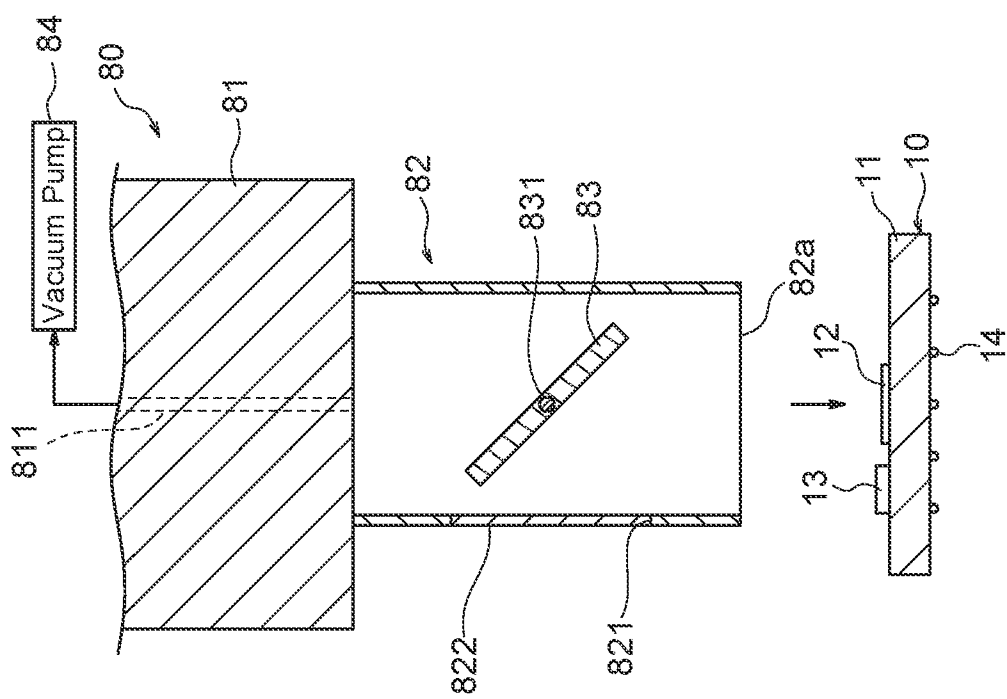

The DUT 10 to be tested is a so-called AiP (Antenna in Package) device, including a device antenna 12 formed on the substrate 11, a semiconductor chip 13 mounted on the upper surface of the substrate 11, and input and output terminals 14 formed on the lower surface of the substrate 11 (see FIG. 3A). The semiconductor chip 13 is a device for controlling the transmission and reception of the device antenna 12. Specific examples of device antennas 12 may include patch antennas, dipole antennas, and Yagi antennas. The semiconductor chip 13 may be mounted on the lower surface of the substrate 11 although not shown.

The DUT 10 in the present embodiment corresponds to an example of the "DUT," and the device antenna 12 in the present embodiment corresponds to an example of the "first antenna," in this disclosure.

As shown in FIG. 1, the electronic component testing apparatus 1 according to the present embodiment includes handler 2 for moving the DUT 10 and a tester 3 for performing the DUT 10 test. The handler 2 presses the DUT 10 against a socket 90 (described later) mounted on a test head 32 (described later) of the tester 3, and electrically connects the DUT 10 to the tester 3. Thereafter, the tester 3 performs the following test on the DUT 10. First, the tester 3 sends a test signal to the DUT 10 through the socket 90, to radiate radio waves from the device antenna 12 of the DUT 10. This radio wave is received by a test antenna 60 (to be described later) provided in an anechoic chamber 50 (to be described later) to test the radio wave radiation characteristics of the DUT 10. Then, the test antenna 60 radiates radio waves and the DUT 10 receives the radio wave to test the radio wave reception characteristics of the DUT 10.

The electronic component testing apparatus 1 in the present embodiment corresponds to an example of an "electronic component testing apparatus," the handler 2 in the present embodiment corresponds to an example of an "electronic component handling apparatus," and the tester 3 in the present embodiment corresponds to an example of a "tester," in this disclosure.

The handler 2, as shown in FIGS. 1 and 2, includes a thermostatic chamber 20, a window 40, an anechoic chamber 50, a test antenna 60, a contact arm 71, a dry air supply device 72, and a heater 73.

The thermostatic chamber 20 in the present embodiment corresponds to an example of the "thermostatic chamber," the window 40 in the present embodiment corresponds to an example of the "first window," the anechoic chamber 50 in the present embodiment corresponds to an example of the "anechoic chamber," the test antenna 60 in the present embodiment corresponds to an example of the "second antenna,", the contact arm 71 in the present embodiment corresponds to an example of the "moving device," the dry air supply device 72 in the present embodiment corresponds to an example of the "supply device," and the heater 73 in the present embodiment corresponds to an example of the "heater," in this disclosure.

As shown in FIG. 1, the handler 2 has a laterally projecting portion, the thermostatic chamber 20 is accommodated in the projecting portion, and a test head 32 is disposed in a space below the projecting portion. That is, the chamber 20 is disposed above the test head 32. Inside the thermostatic chamber 20, a socket 90 is disposed through an opening formed in the bottom of the thermostatic chamber 20, the chamber 20 is a device for applying a temperature of high temperature or low temperature to the DUT 10 disposed in the socket 90. The temperature of the thermostatic chamber 20 may be adjustable in the range of −55° C. to +155° C. although not limited.

In the present embodiment, an opening 21 is formed in the side wall surface 20*a* of the thermostatic chamber 20. The wall surface 20*a* faces the surface anechoic chamber 50 disposed adjacent to the thermostatic chamber 20. The opening 21 in the present embodiment corresponds to an example of the "first opening" in this disclosure.

The window 40 is fitted into the opening 21 and closes the opening 21 in an airtight manner. As shown in FIG. 2, the window 40 includes a pair of plate-shaped members 41, a spacer 42, and a space 43 surrounded by the pair of plate-shaped members 41 and the spacer 42. The window 40 is disposed in the opening 21, insulating the anechoic chamber 50 disposed adjacent to the thermostatic chamber 20 and the thermostatic chamber 20. The plate-shaped member 41 in the present embodiment corresponds to an example of the "plate-shaped member," and the spacer 42 in the present embodiment corresponds to an example of the "spacer," in this disclosure.

A pair of plate-shaped members 41 are disposed in the opening 21, are arranged substantially parallel on both sides of the space 43. The plate-shaped member 41 is made of a material capable of transmitting radio waves radiated from the device antenna 12 and the test antenna 60. As a specific example of the material constituting the plate-shaped member 41 includes, for example, a reinforced glass and a PEEK (polyether ether ketone) material.

The spacer 42 is, although not limited, a rectangular frame with a substantially U-shaped cross-sectional shape, and is provided along the outer periphery of the plate-shaped member 41. The pair of plate-shaped members 41 are arranged at a distance from each other by the spacer 42, determining a space 43 surrounded by the pair of plate-shaped members 41 in the window 40. This enhances the thermal insulation performance of the window 40.

The anechoic chamber 50, as shown in FIGS. 1 and 2, includes a shield box 51 and a radio wave absorber 52 disposed on the inner wall of the shield box 51. This anechoic chamber 50 prevents the intrusion of unnecessary radio waves from the outside and eliminates the reflection of internal radio waves. The radio wave absorber 52 in the present embodiment corresponds to an example of the "radio wave absorber" in this disclosure.

The shield box 51 is a metal box including a metal such as aluminum. The shield box 51 has a function of blocking radio waves from the outside.

The radio wave absorber 52 has a plurality of arranged quadrangular pyramid-shaped members and is disposed on the inner wall of the shield box 51. The material of the radio wave absorber 52 includes, for example, ferrite, a resin material. The radio wave absorber 52 has a function of absorbing radio waves inside the anechoic chamber 50 and eliminating reflection of radio waves inside the anechoic chamber 50.

In the present embodiment, the anechoic chamber 50 includes an opening 53 that opens in the lateral direction. The opening 53 is formed on a surface adjacent to the thermostatic chamber 20 of the wall surfaces of the anechoic chamber 50. The anechoic chamber 50 is connected to the thermostatic chamber 20 so that the opening 53 and the opening 21 face each other. That is, in the present embodiment, the anechoic chamber 50 is disposed on the side (horizontal direction) of the thermostatic chamber 20. This structure makes easier to do maintenance work of the anechoic chamber as compared with providing the anechoic chamber at the upper part of the thermostatic chamber. The opening 53 in the present embodiment corresponds to an example of the "second opening" in this disclosure.

The test antenna 60 is disposed inside the anechoic chamber 50. The test antenna 60 is an antenna for receiving radio waves radiated from the device antenna 12 of the DUT 10 and radiating radio waves to the device antenna 12. The test antenna 60 includes a horn antenna and a patch antenna. The test antenna 60 may, for example, include a plurality of patch antennas formed in a matrix on a substrate although not limited.

The test antenna 60 is disposed in the anechoic chamber 50 toward the opening 53 to receive the radio wave through the opening 53 and radiate the radio wave toward the opening 53. In other words, the opening 53 of the anechoic chamber 50 is formed to open toward the transmission and reception direction of the radio wave of the test antenna 60. Test antenna 60 is fixed by a fixing member 55 attached to the wall surface of the anechoic chamber 50.

The contact arm 71 is a device for moving the DUT 10, supported by rails (not shown) provided in the handler 2. The contact arm 71 includes an actuator for horizontal movement (not shown) and can move back and forth and left and right according to the rail. Further, the contact arm 71 includes an actuator for vertical drive (not shown) and can move in the vertical direction. The contact arm 71, including a contact chuck 80 attached to the distal end of the contact arm 71, can hold and move the DUT 10. The contact chuck 80 in the present embodiment corresponds to an example of the "holding portion" in this disclosure.

The dry air supply device 72 is a device for supplying dry air to the space 43 of the window 40. The dry air supply device 72 includes, for example, a pump and a dehumidifier, as shown in FIG. 2, and communicates with the space 43 of the window 40 through the supply pipes 722 and the supply ports 721 disposed inside the wall surface 20*a* of the thermostatic chamber 20.

The dry air sent from the dry air supply device 72 is supplied to the space 43 through one supply port 721 and one supply pipe 722. The dry air supplied to the space 43 is collected into dry air supply device 72 through the other supply port 721 and the other supply pipe 722 and discharged to the atmosphere. The dry air may have a humidity grade 1 (pressure dew point≤−70° C.) in JISB8392-1 although not limited. The dry air supply device 72 always supplies dry air to the space 43 of the window 40 during the handler 2 activating.

As described above, in the present embodiment, supplying dry air to the space 43 prevents the plate-shaped member 41 from getting high temperature due to the temperature rise in the thermostatic chamber 20. Additionally, millimeter waves are typically easy to be absorbed by moisture. In the present embodiment, supplying dry air to the space 43 reduces the dew condensation in the plate-shaped members 41 at a low temperature This reduces the absorption of the radio waves to water droplets caused by dew condensation.

The heater 73 is a device for heating the plate-shaped members 41 of the anechoic chamber 50 side. The heater 73 has a rod shape, as shown in FIG. 2, is attached along the vertical direction in the wall surface of the shield box 51 of the anechoic chamber 50. Such heater 73 includes a rod-shaped cartridge heater although not limited. The heater 73 may be disposed in the vicinity of the opening 53 although not limited.

The heater 73 warms the plate-shaped member 41 disposed in the anechoic chamber 50 side of the pair of plate-shaped members 41. This reduces the dew condensation in the plate-shaped member 41 at a low temperature.

Figure 4:
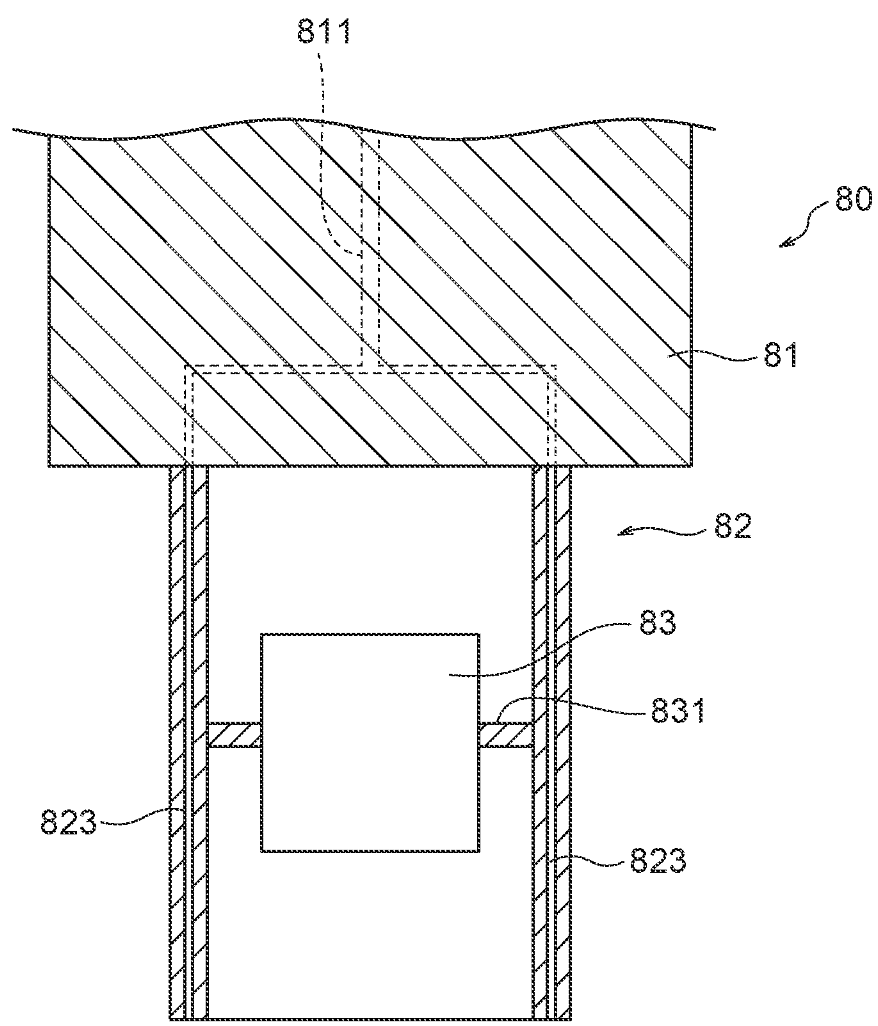
FIG. 4 is a cross-sectional view showing a first modification of the contact chuck in the first embodiment of the present invention.
Figure 5:
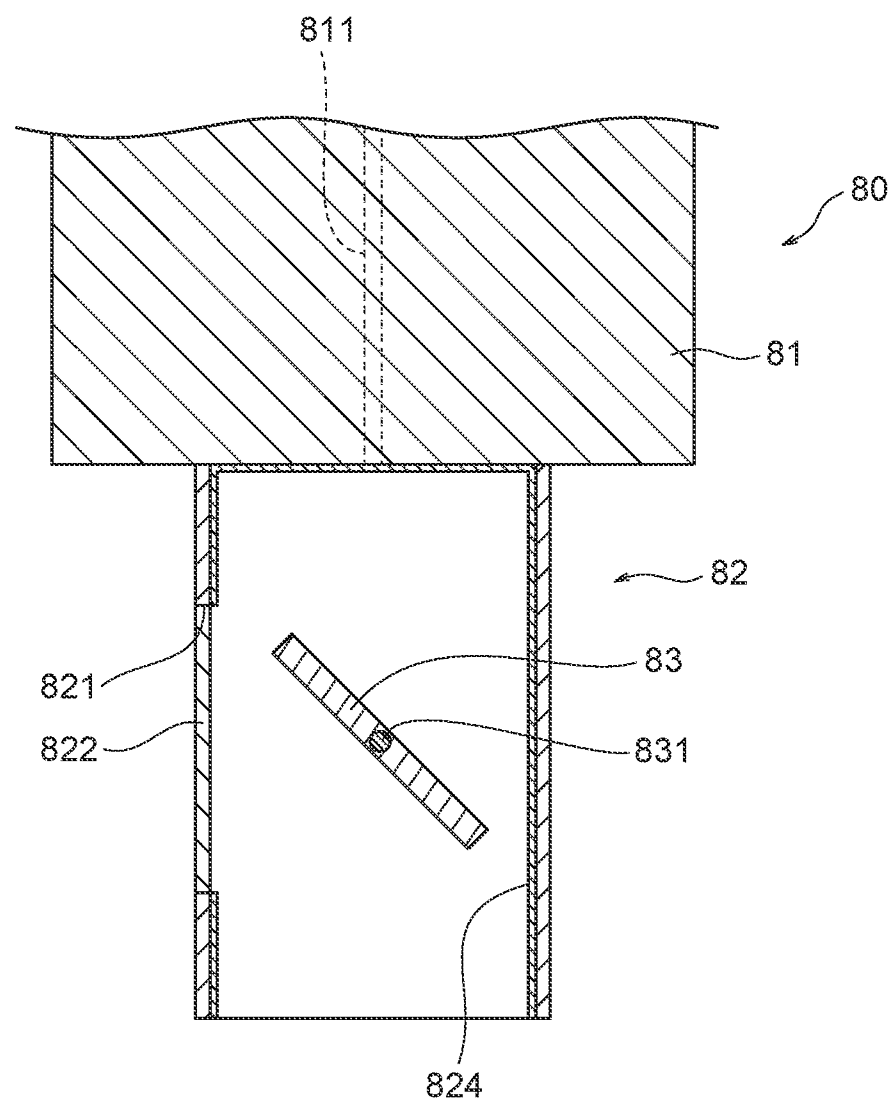
FIG. 5 is a cross-sectional view showing a second modification of the contact chuck in the first embodiment of the present invention.
Figure 6:
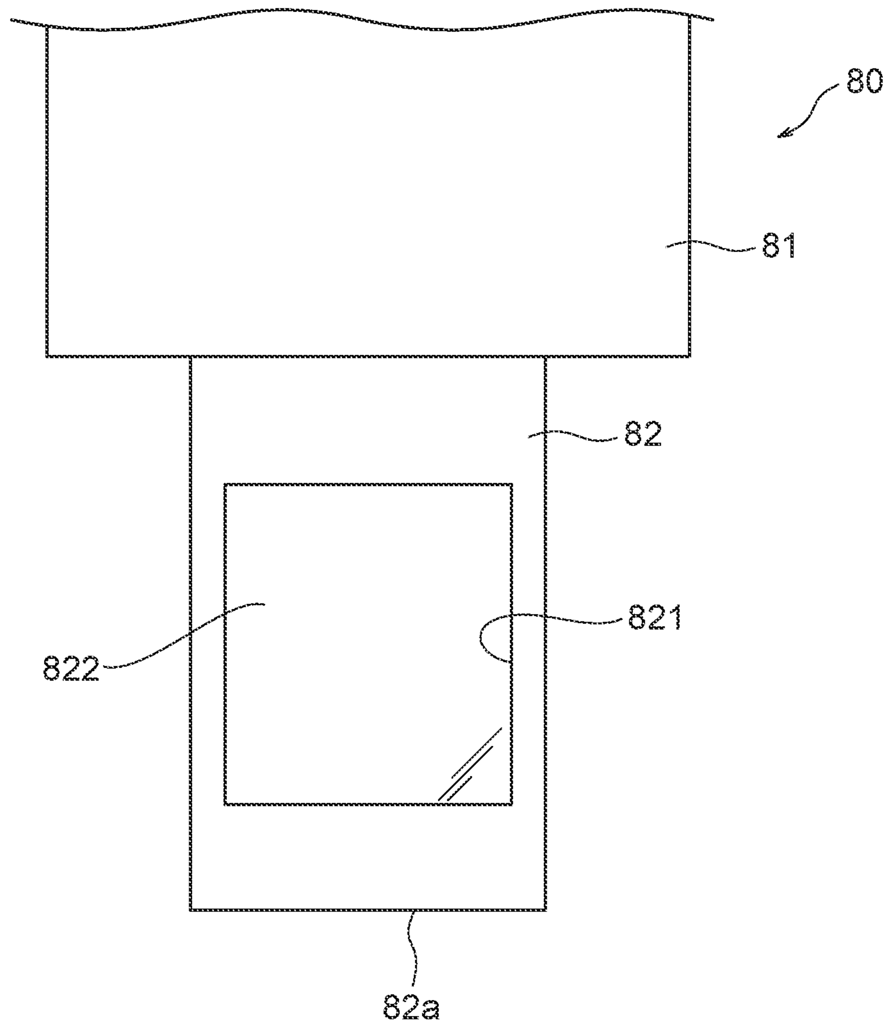
FIG. 6 is a side view showing the pusher according to the first embodiment of the present invention and is a view of the pusher along the VI direction of FIG. 1.
Figure 7:
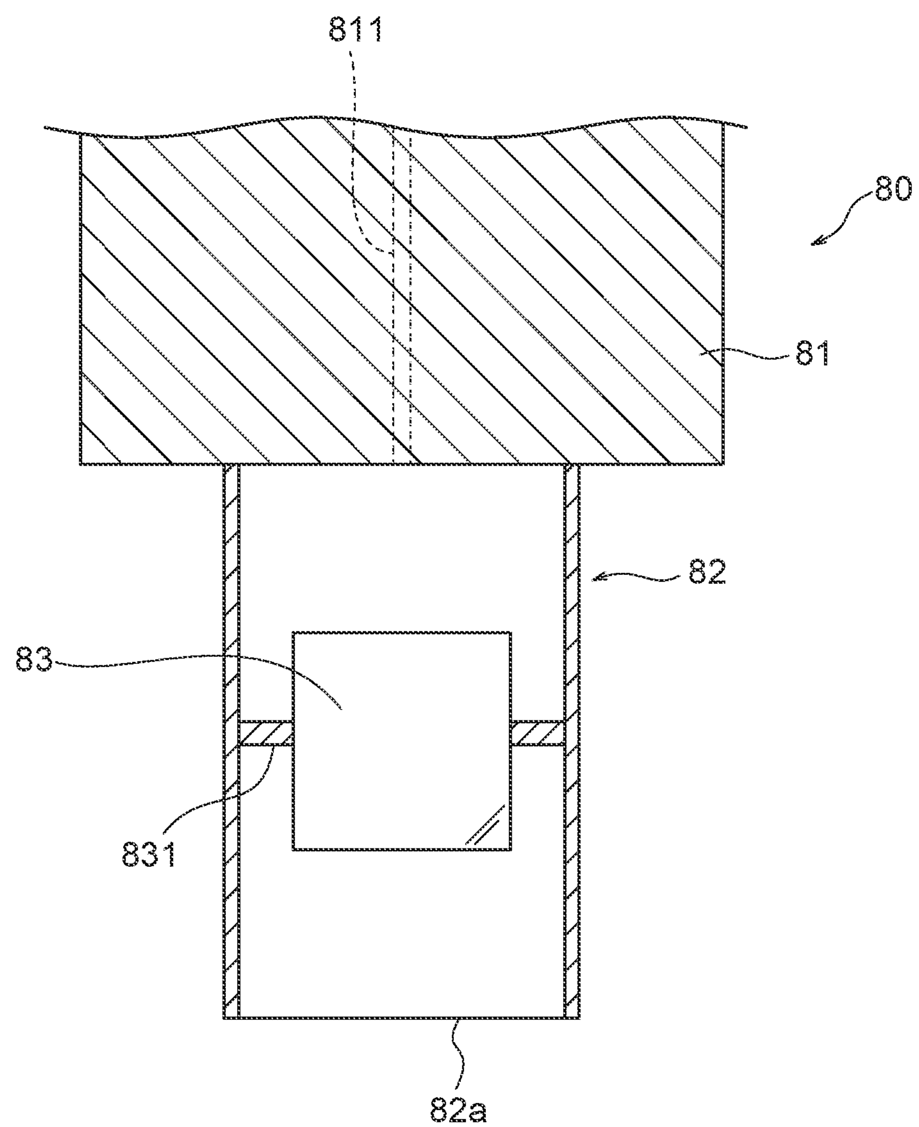
FIG. 7 is a cross-sectional view of the pusher according to the first embodiment of the present invention and is a cross-sectional view taken along VII-VII line of FIG. 1.

FIGS. 3A and 3B are sectional views each showing a contact chuck in the present embodiment, FIG. 3A is a diagram showing a state before the contact chuck contacts the DUT, FIG. 3B is a diagram showing the contact chuck in contact with the DUT. FIG. 4 is a sectional view showing a first modification of the pusher in the present embodiment, FIG. 5 is a sectional view showing a second modification of the pusher in the present embodiment. FIG. 6 is a side view showing a pusher in the present embodiment, a view of the pusher along the VI direction of FIG. 1. FIG. 7 is a cross-sectional view of the pusher according to the present embodiment, and is a cross-sectional view taken along VII-VII line of FIG. 1.

The contact chuck 80, as shown in FIG. 3A, includes a body 81, a pusher 82 to contact the DUT 10, and a reflector 83 for reflecting radio waves. The contact chuck 80 has a function of holding the DUT 10 by suction. The pusher 82 in the present embodiment corresponds to an example of the "touching portion," and the reflector 83 in the present embodiment corresponds to an example of the "reflector," in this disclosure.

The body 81 includes a suction pipe 811 for holding the DUT 10 by suction. The suction pipe 811 is formed along the vertical direction inside the body and is open at the lower surface of the body 81. Sucking air from the suction pipe 811 by the vacuum pump 84 allows the contact arm 71 to hold the DUT 10. The vacuum pump 84 in the present embodiment corresponds to an example of the "suction device" in this disclosure.

The pusher 82 is detachably mounted to the body 81. The pusher 82 has a square tubular shape and the upper end of the pusher 82 is mounted to contact the lower surface of the chuck body 81. A lower end 82*a* of the pusher 82 is open and the opening of the lower end 82*a* has a size enough to surround the device antenna 12 of the DUT 10. As shown in FIG. 3B, contact of the lower end 82*a* with the DUT 10 to surround the device antenna 12 of the DUT 10 seals the space in the pusher 82. Sucking the space in the body 81 by the vacuum pump 84 allows the contact chuck 80 to suck the DUT 10.

The pusher 82, as shown in FIG. 4, may have a plurality of suction pipes 823. The suction pipes 823 are formed inside the wall surface of the pusher 82, with communicating with the suction pipe 811 of the body 81 and open at the lower end 82*a* of the pusher 82. The suction pipe 811 is not open at the lower surface of the body 81. In this modification, sucking air from the suction pipe 823 enables to suck and hold the DUT 10 when the lower end 82*a* contacts the DUT 10.

In the modification shown in FIG. 4, the body 81 need not have a cylindrical shape. For example, the body 81 may be composed of four columnar members disposed to surround the reflector 83, holding the reflector 83 in the columnar member, include the suction pipe 823 within the columnar member.

As shown in FIG. 5, the pusher 82 may have a sheet-like radio wave absorber 824 disposed on the inner wall of the pusher 82. The radio wave absorber 824 includes the same material as that constituting the radio wave absorber 52 described above.

When the contact chuck 80 holds the DUT 10, as shown in FIG. 3A, the contact chuck 80 moves right above the DUT 10 by the contact arm 71. Then, as shown in FIG. 3B, contact of the lower end 82*a* of the pusher 82 with the DUT 10 by the contact arm 71 determines a sealed space surrounded by the chuck body 81, the pusher 82, and the DUT 10. Sucking the air of the sealed space from the suction pipe 811 causes the contact chuck 80 to hold the DUT 10.

The pusher 82 of the present embodiment further includes an opening 821 and a window 822. The opening 821 in the present embodiment corresponds to an example of the "third opening," and the window 822 in the present embodiment corresponds to an example of the "second window," in this disclosure.

The opening 821, as shown in FIG. 6, has a rectangular shape and is formed on the side wall of the pusher 82. The opening 821 is disposed to face the opening 21 of the thermostatic chamber 20 with the DUT 10 pressed against the socket 90 by the contact chuck 80 of the contact arm 71 during the test. The shape of the opening 821 is not particularly limited to a rectangular and may be a circle or a triangle.

The window 822 is fitted into the opening 821 as shown in FIG. 6. The window 822 is a single flat plate-shaped member capable of transmitting radio waves radiated from the device antenna 12. The window 822 transmits radio waves radiated from the device antenna 12 of the DUT 10 toward the test antenna 60 in the anechoic chamber 50 and transmits radio waves emitted from the test antenna 60 toward the device antenna 12 during test of the DUT 10. The window 822 is made of a material capable of transmitting radio waves radiated from the device antenna 12 and the test antenna 60, and the material include tempered glasses and PEEK materials. The opening 821 is closed by the window 822 in an airtight manner.

The reflector 83, as shown in FIGS. 3(*a*) and 7, is a rectangular flat plate-shaped reflecting plate made of metal and is provided inside the cylindrical pusher 82. Specifically, the reflector 83 is fixed (held) to the inner wall of the pusher 82 by the pin 831 penetrating the reflector 83 in the width direction. The reflector 83 is provided to face the DUT on the normal of the mounting surface 93 with the pusher 82 in contact with the DUT 10. That is, the reflector 98 is provided to position right above the device antenna 12 when the pusher 97 is in contact with the DUT 10. The reflector 83 changes the traveling direction of the radio wave radiated from the device antenna 12 of the DUT 10 toward the test antenna 60 provided in the anechoic chamber 50 and changes the traveling direction of the radio wave radiated from the test antenna 60 to the device antenna 12 when testing the DUT 10 (see FIG. 9).

The reflector 83 is inclined with respect to the mounting surface 93 of the DUT 10 in the sockets 90 provided in the test head 32. The tilt angle of the reflector 83 with respect to the mounting surface 93 is, when testing the DUT 10, set to reflect the radio waves radiated from the device antenna 12 in a direction toward the test antenna 60 and to reflect the radio waves radiated from the test antenna 60 in a direction toward the device antenna 12. For example, the angle of inclination of the reflector 83 with respect to the mounting surface 93 is 45°. Such reflector 83 in the pusher 82 allows to arrange the anechoic chamber 50 on the side of the thermostatic chamber 20 as described above. The mounting surface 93 in the present embodiment corresponds to an example of the "main surface of the socket" in this disclosure.

The reflector 83 is not particularly limited to rectangular shape and may be a circular shape or a triangular shape. The reflector 83 is not particularly limited to flat plate, for example, may be a recessed spherical central portion.

As shown in FIG. 1, the tester 3 includes a main frame 31, the test head 32, and the socket 90. The main frame 31 is connected to the test head 32 via a cable 311 and to the test antenna 60 via a cable 312. The main frame 31 sends test signals to the DUT 10 through the test head 32 to test the DUT 10 and evaluates the DUT 10 according to the test result.

The test head 32 is connected to the main frame 31 via cables 311 and sends test signals to the DUT 10 during the testing. In the test head 32, the pin electronics card electrically connected to the socket 90 is housed although not shown.

Figure 8:
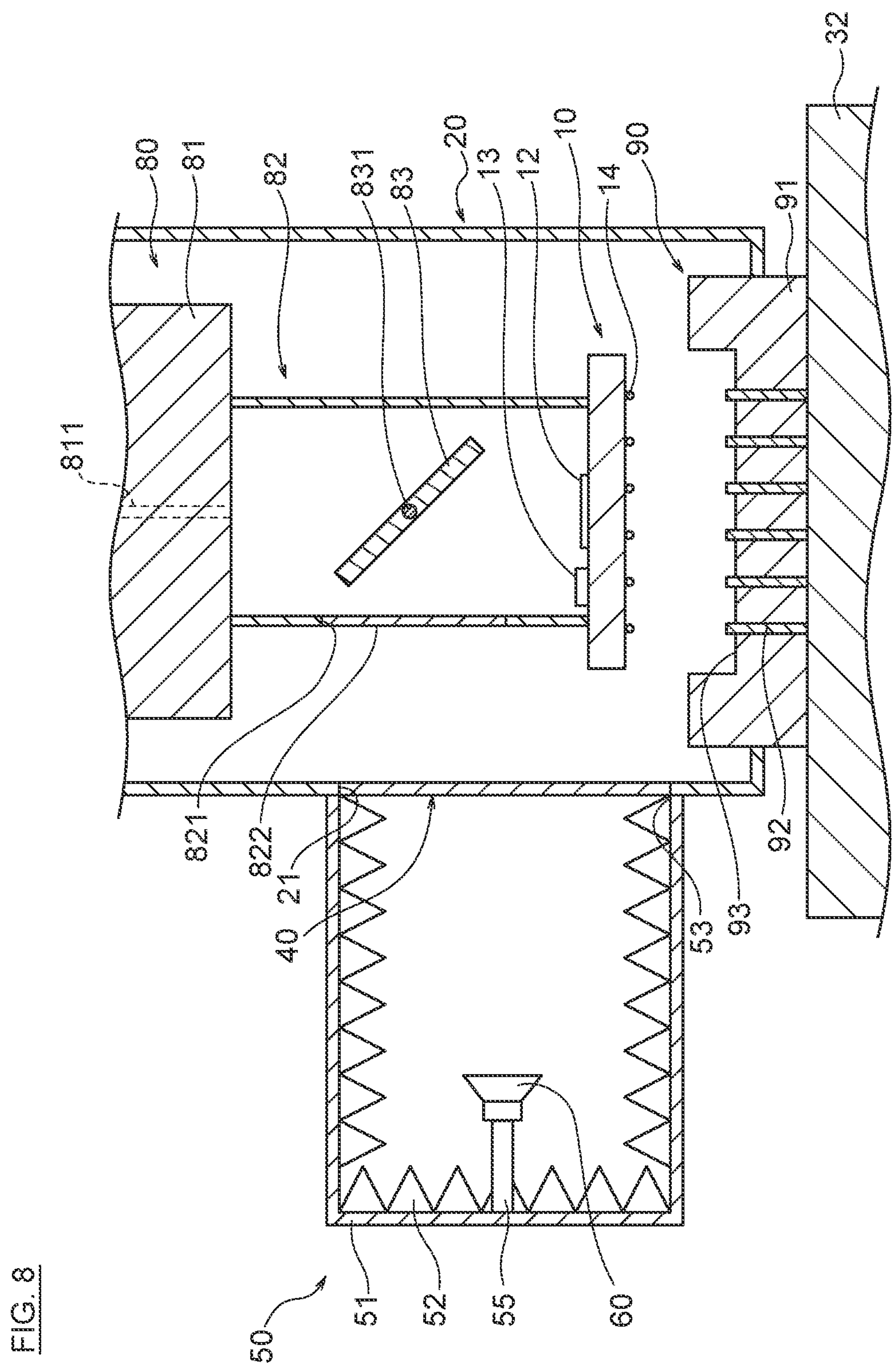
FIG. 8 is an enlarged cross-sectional view corresponding to VIII portion of FIG. 1, showing the DUT prior to pressing the DUT against the socket.
Figure 9:
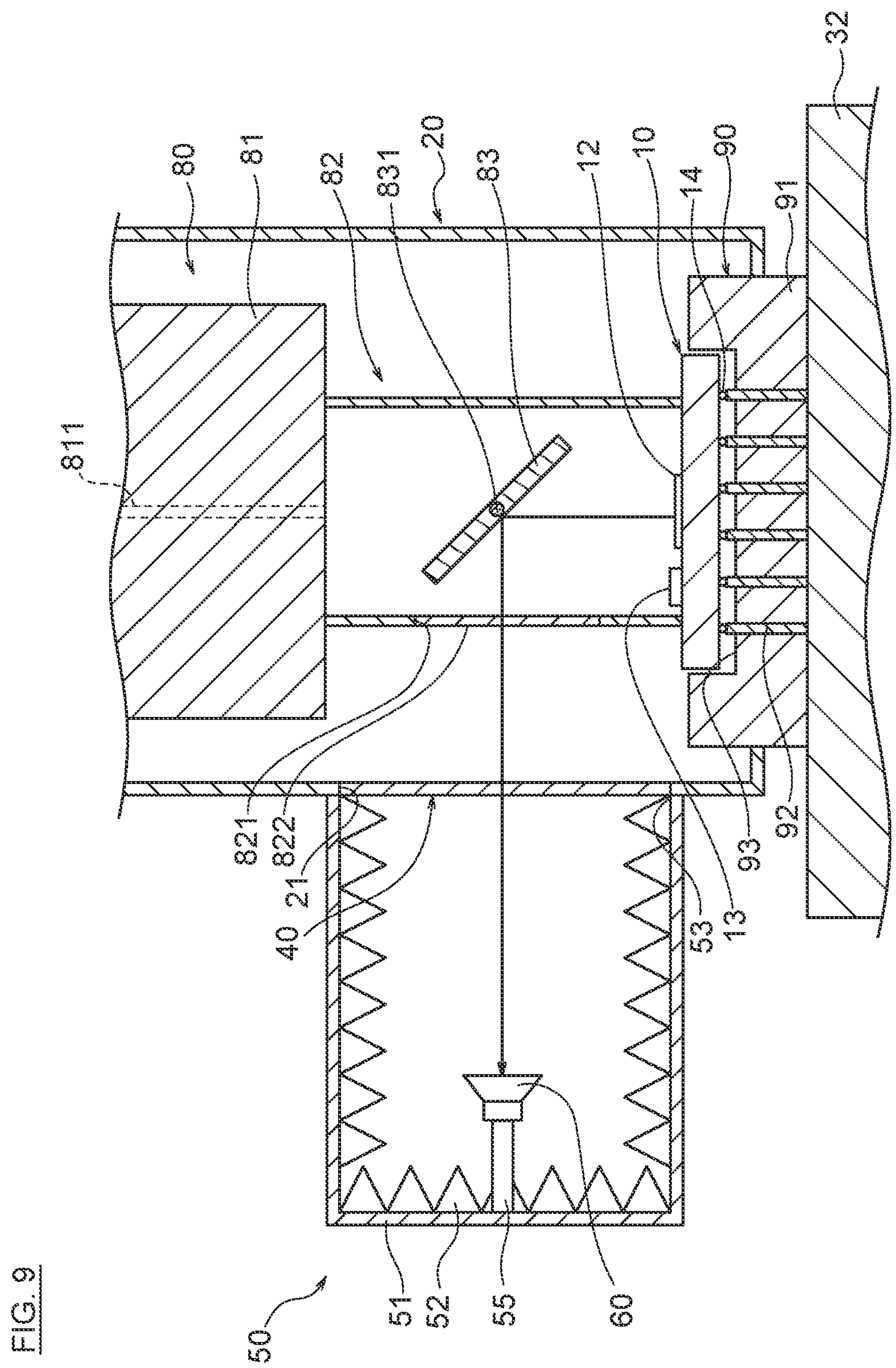
FIG. 9 is an enlarged cross-sectional view corresponding to VIII portion of FIG. 1, showing the DUT pressed against the socket.

The socket 90 is mounted on the test head 32 and includes a socket body 91, contactors 92 (refer to FIGS. 8 and 9). The contactors 92 are held by the socket body 91 and disposed to correspond to the input and output terminals 14 of the DUT 10. The contactors 92 include pogo pins and anisotropic conductive rubber sheets although not limited. Contacting of the input and output terminals by the contact arm 71 with the contactors 92 makes the electrical connection between the DUT 10 and the socket 90. Through the socket 90, the test signals are sent from the main frame 31 to the DUT 10.

Hereinafter, the OTA test of the DUT 10 by the electronic component testing device 1 according to the present embodiment will be described by referring to FIGS. 3A, 3B, 8, and 9.

FIGS. 8 and 9 are enlarged cross-sectional views each corresponding to VIII portion of FIG. 1, FIG. 8 is a view showing a state prior to pressing the DUT to the socket, and FIG. 9 is a view showing the DUT pressed to the socket.

First, the thermostatic chamber 20 adjusts the thermostatic chamber 20 to a predetermined temperature and the dry air supply device 72 starts to supply dry air to the space 43.

Then, as shown in FIG. 3A, the contact arm 71 of the handler moves right above the DUT 10, descending toward the DUT 10 as shown in FIG. 3B. The lower end 82*a* of the pusher 82 contacts the DUT 10 to surround the device antenna 12.

Sucking air from the suction pipe 811 of the body 81 causes the contact chuck 80 sucks and holds the DUT 10. Then, as shown in FIG. 8, the contact chuck 80 moves right above the socket 90 by the contact arm 71.

As shown in FIG. 9, the contact chuck 80 goes down by the contact arm 71. This presses the DUT 10 held by the contact chuck 80 against the socket 90 and causes the input and output terminals 14 of the DUT 10 to contact the contactors 92 of the socket 90. With the DUT 10 pressed against the socket 90, the opening 821 of the pusher 82 faces the opening 21 of the thermostatic chamber 20. This arranges the reflector 83, openings 821, 21, 53, and the test antenna 60 side by side on the same straight line.

Then, with the DUT 10 pressed against the socket 90, the following the DUT 10 test for determining the characteristics of the radio wave radiation and reception is performed.

Specifically, the test signals outputted from the main frame 31 are transmitted to the DUT 10 via the contactors 92 of the sockets 90 mounted on the test head 32. The DUT 10 receiving the test signal, as shown in FIG. 9, radiates radio waves upward from the device antenna 12. The radio wave reaches the reflector and is reflected in the direction of the anechoic chamber 50 by the reflector 83. The radio wave passes through the window 822 and 40, enters the anechoic chamber 50, and is received by the test antenna 60. The radio wave received is converted into an electric signal and transmitted to the main frame 31 via the cable 312. The radio wave radiation characteristic of the DUT 10 is evaluated using the signal.

Next, while keeping the DUT 10 pressed against the socket 90, the test signal outputted from the main frame 31 is sent to the test antenna 60 via the cable 312. The test antenna 60 radiates a radio wave toward the opening 53 of the anechoic chamber 50. This radio wave, after passing through the window 40,822, reaches the reflector 83 and is reflected toward the DUT 10 by the reflector 83. This radio wave is received by the DUT 10 device antenna 12. The radio wave is converted into an electric signal and sent to the main frame 31 via the contactors 92 of the socket 90, the test head 32, and the cable 311. Using the signal, the radio wave reception characteristics of the DUT 10 is evaluated.

After the evaluation of the DUT 10, the contact arm 71 moves upwards and the DUT 10 is moved away from the sockets 90. This completes the DUT 10 test.

As described above, in this embodiment, the thermostatic chamber 20 and the anechoic chamber 50 are connected to each other so that the opening 21 and 53 face each other, the window 40, which is capable of transmitting the radio wave radiated from the device antenna 12 and the test antenna 60, closes the opening 21. This structure, on the test of the DUT 10 while applying a temperature (high temperature or low temperature) to the DUT 10 in the thermostatic chamber 20, protects the radio wave absorber 52 in the anechoic chamber 50 from thermal stress and reduce the damage of the radio wave absorber 52. This allows to perform the OTA test of the DUT 10 with high accuracy.

Additionally, the normal handler includes the contact chuck located above the DUT. The normal handler cannot perform the OTA test since the contact chuck is interposed between the device antenna and the test antenna although the device antenna and the test antenna need to be disposed at a distance at the OTA test in the far-field.

In contrast, in one or more embodiments, the contact chuck 80 including the reflector 83 enables to perform the OTA test in the far-field while pressing the DUT 10 to the socket 90 by the contact arm 71. This eliminates to manually attach the DUT 10 to the sockets 90 and enables automatically a large number of the DUT 10 tests in succession using the handlers 2, thus, makes more efficient the OTA test of the DUT 10 having the device antenna 12.

Figure 10:
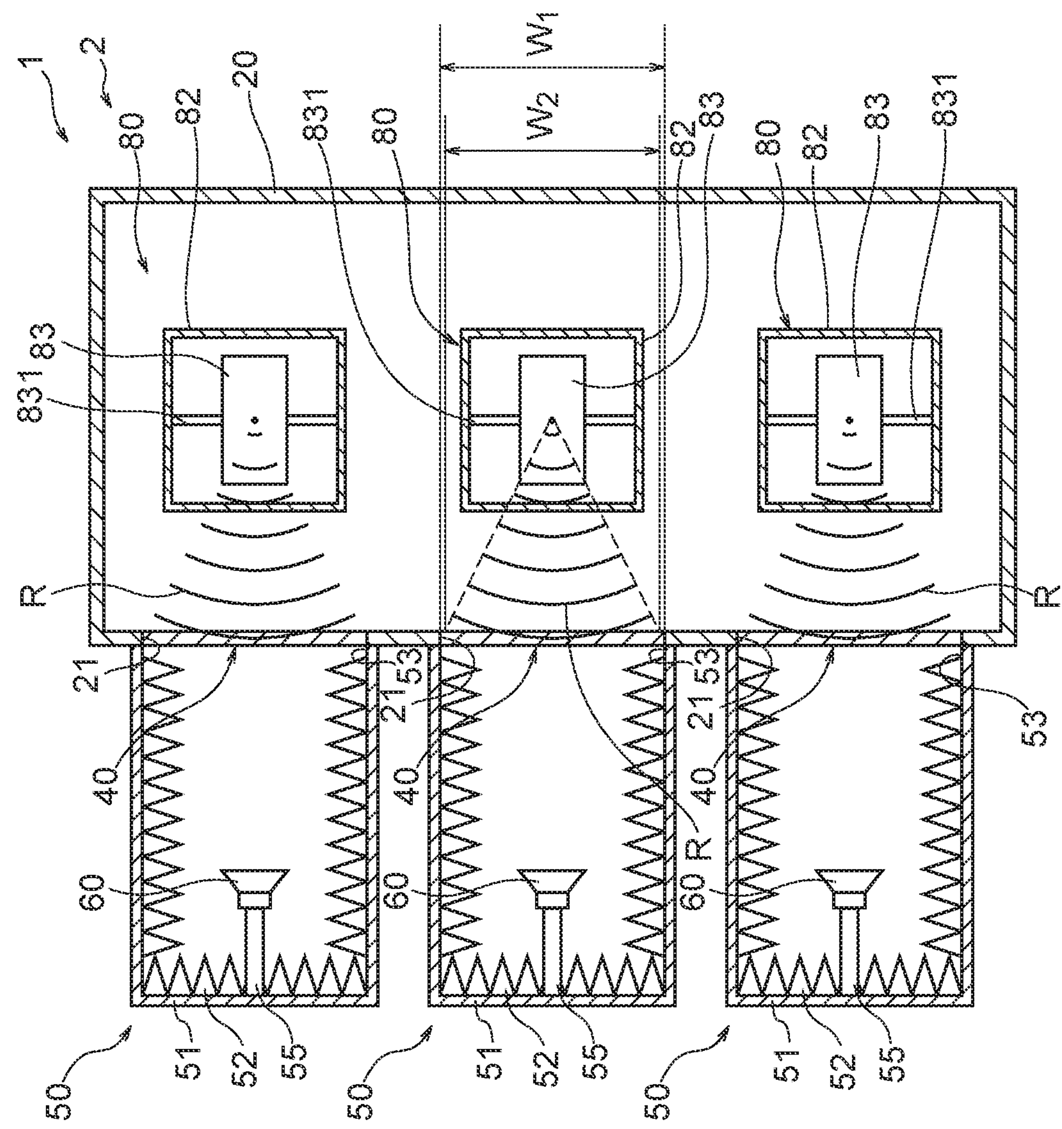
FIG. 10 is a cross-sectional view showing a first modification of the electronic component testing apparatus according to the first embodiment of the present invention.

Although the handler 2 includes only one anechoic chamber 50 in the present embodiment, as shown in FIG. 10, the handler 2 may include a plurality of anechoic chambers 50. The handler 2 includes a plurality of anechoic chambers 50 and can test a plurality of the DUT 10 at the same time. FIG. 10 is a cross-sectional view showing a first modification of the electronic component testing apparatus according to the first embodiment of the present invention, a cross-sectional view taken along the horizontal direction of the electronic component testing apparatus as viewed from above.

In the modification shown in FIG. 10, a plurality of anechoic chambers 50 are arranged so that the transmission and reception directions of radio waves of each test antenna 60 are respectively parallel, adjacent to the thermostatic chamber 20. Further, the thermostatic chamber 20 includes the same number of openings 21 as the anechoic chambers 50, each opening 21 is closed by the windows 40. The thermostatic chamber 20 and a plurality of anechoic chambers 50, and an opening 53 of a plurality of openings 21 and a plurality of anechoic chambers 50 are connected to face each other.

Further, in the modification shown in FIG. 10, the handler 2 includes the same number of contact arms 71 as the anechoic chambers 50 and each contact arm 71 respectively includes the contact chuck 80. The vertical and horizontal position of each pusher 82, mounted on the contact chuck 80, relative to the corresponding test antenna 60 coincide, respectively.

Further, in the modification shown in FIG. 10, the shape of the reflector 83, the distance between the reflector 83 and the test antenna 60, and the distance between the pusher 82 and the anechoic chamber 50 is adjusted so that the radio waves reflected by the reflector 83 does not interfere with each other during the test.

Specifically, in FIG. 10, the width $W_1$ of the opening 21 is adjusted equal to or bigger than the width $W_2$ ($W_1 \geq W_2$) of the radio wave R that has reached the window 40 reflected by the reflector 83, in the width direction of the opening 21. This adjustment reduces the interfering of the radio waves reflected by the reflectors 83 each other when testing a plurality of the DUT 10 at the same time. This enables to perform the test of the DUT 10 with high accuracy.

Figure 11:
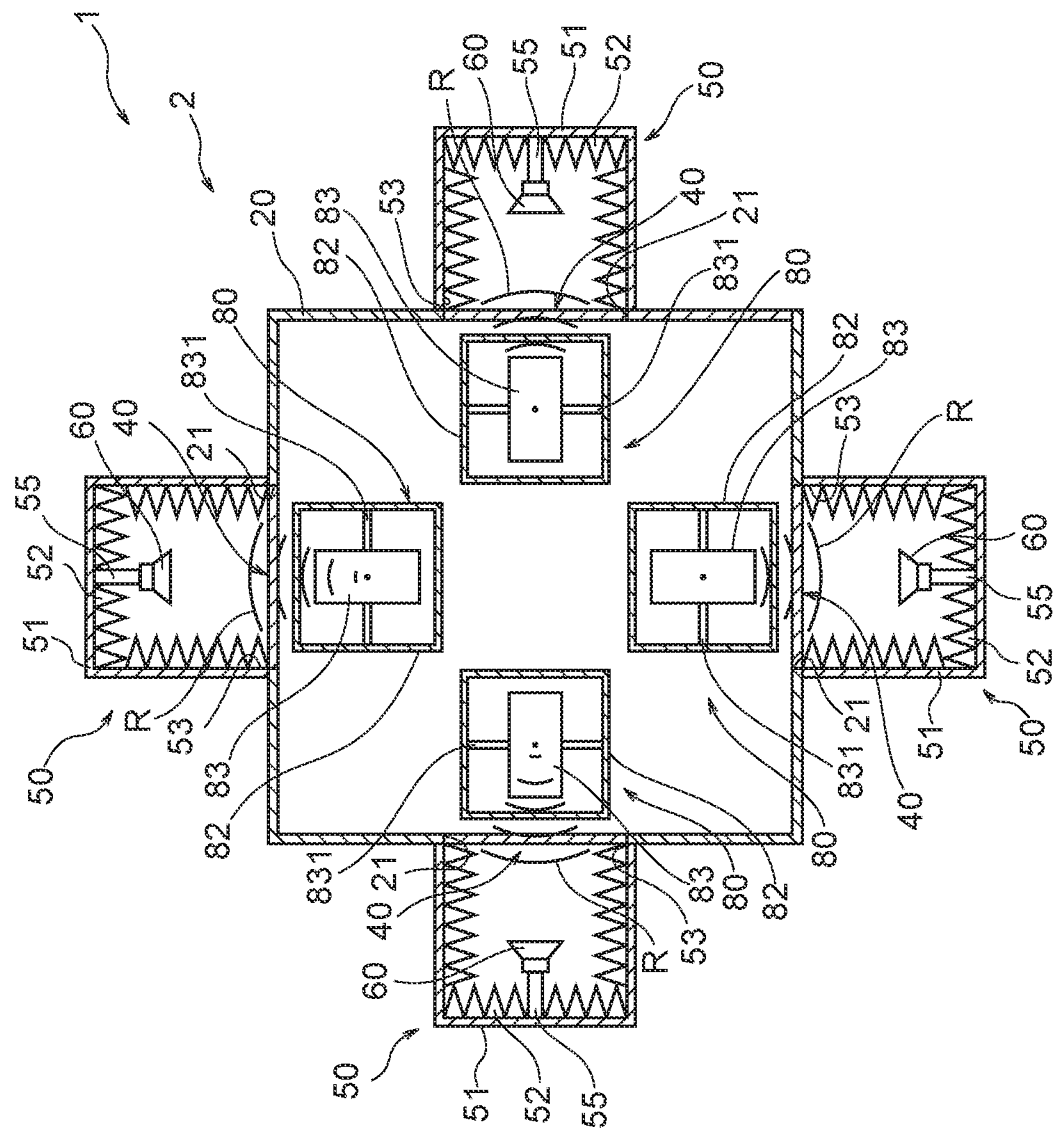
FIG. 11 is a cross-sectional view showing a second modification of the electronic component testing apparatus according to the first embodiment of the present invention.

Alternatively, as shown in FIG. 11, the handler 2 may include a plurality of anechoic chambers 50 adjacent to the four wall surfaces of the thermostatic chamber 20. The handler 2 includes the same number of contact arms 71 as the anechoic chambers 50 and each contact arm 71 includes the contact chuck 80. The vertical and horizontal positions of each pusher 82, mounted on the contact chuck 80, corresponds to the test antenna 60 coincide, respectively. FIG. 11 is a cross-sectional view in a plan view showing a second modification of the electronic component testing apparatus in this embodiment and is a cross-sectional view taken along the horizontal direction of the electronic component test apparatus as viewed from above.

In the modification shown in FIG. 11, the thermostatic chamber 20 includes the same number of openings 21 as the anechoic chambers 50, each opening 21 is closed by the window 40. A plurality of the anechoic chambers 50 are connected to the thermostatic chamber 20 so that the openings 53 of the anechoic chambers 50 faces the corresponding openings 21.

The Second Embodiment

Figure 12:
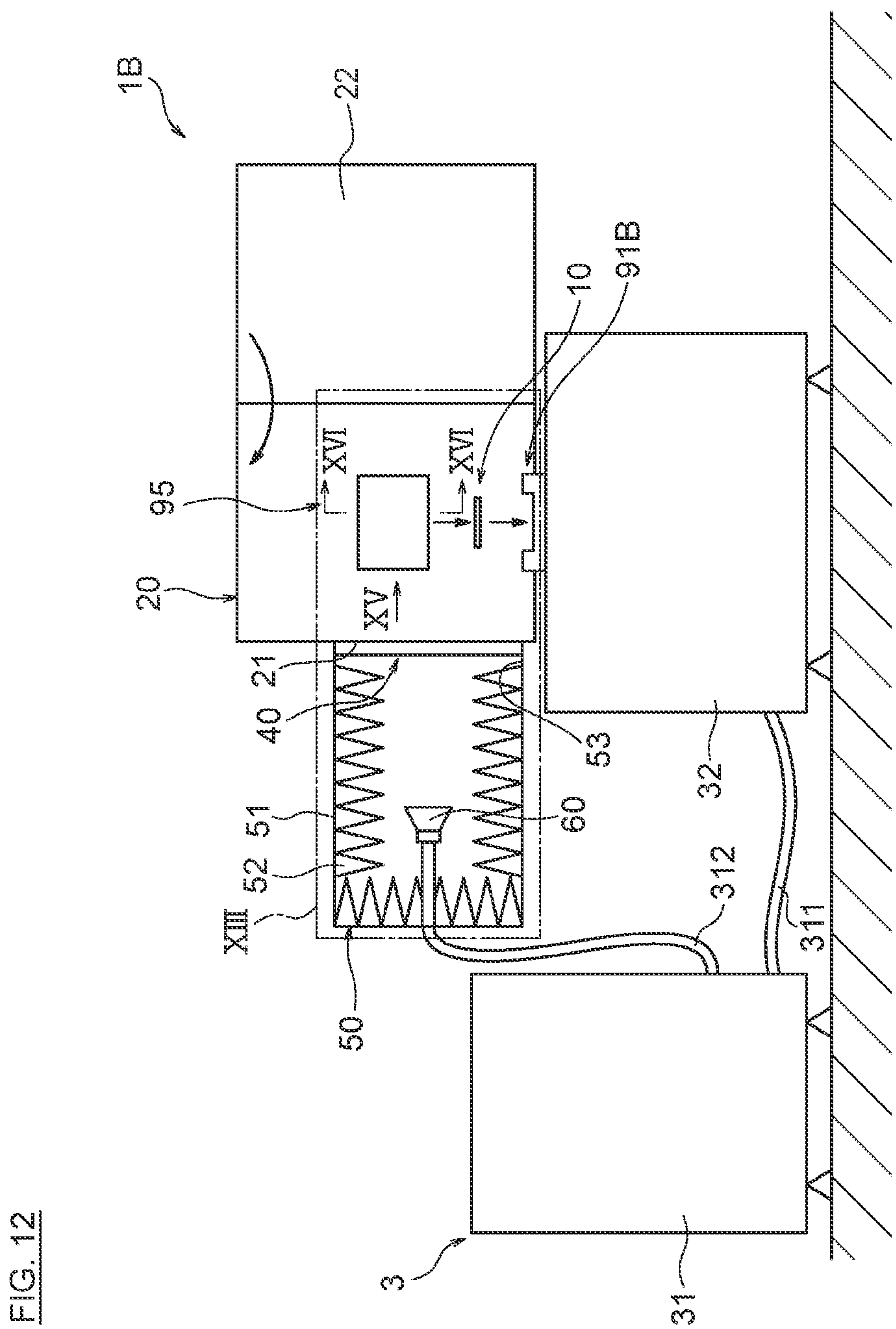
FIG. 12 is a schematic cross-sectional view showing the overall configuration of the electronic component testing apparatus according to the second embodiment of the present invention.
Figure 13:
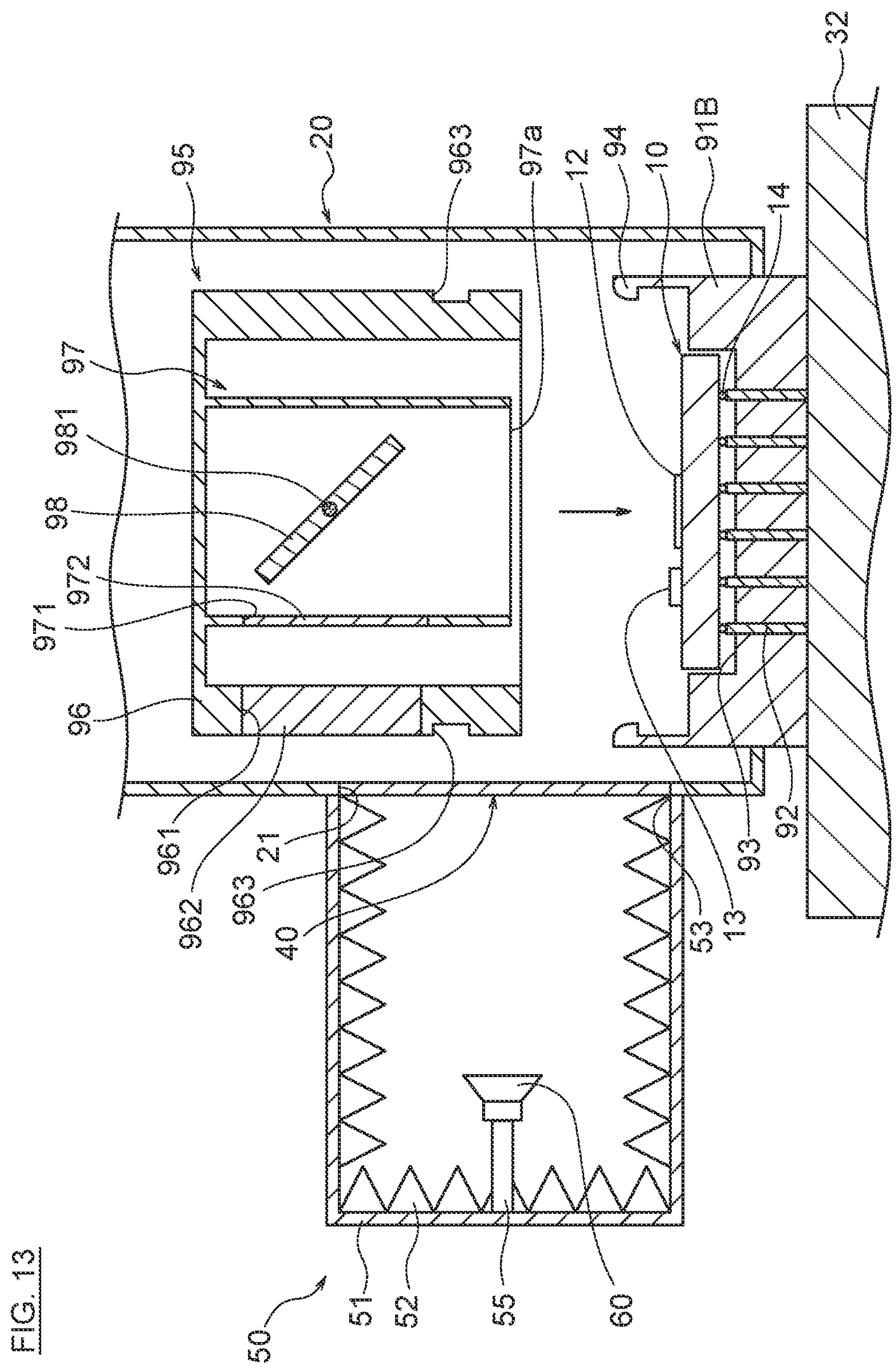
FIG. 13 is an enlarged cross-sectional view corresponding to XIII portion of FIG. 12, showing the DUT prior to pressing the DUT against the socket.
Figure 14:
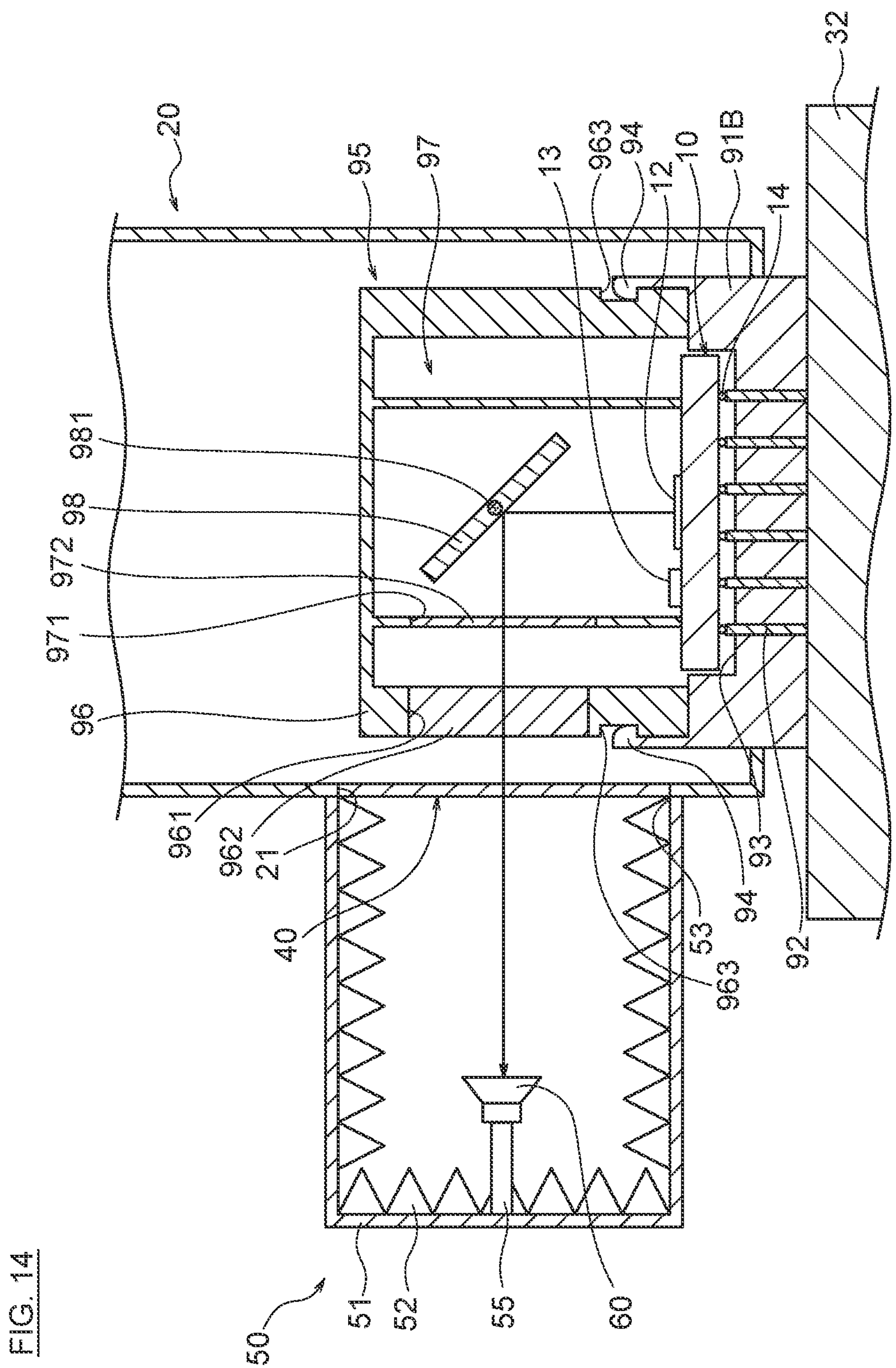
FIG. 14 is an enlarged sectional view corresponding to XIII portion of FIG. 12 is a diagram showing the DUT pressed against the socket.
Figure 15:
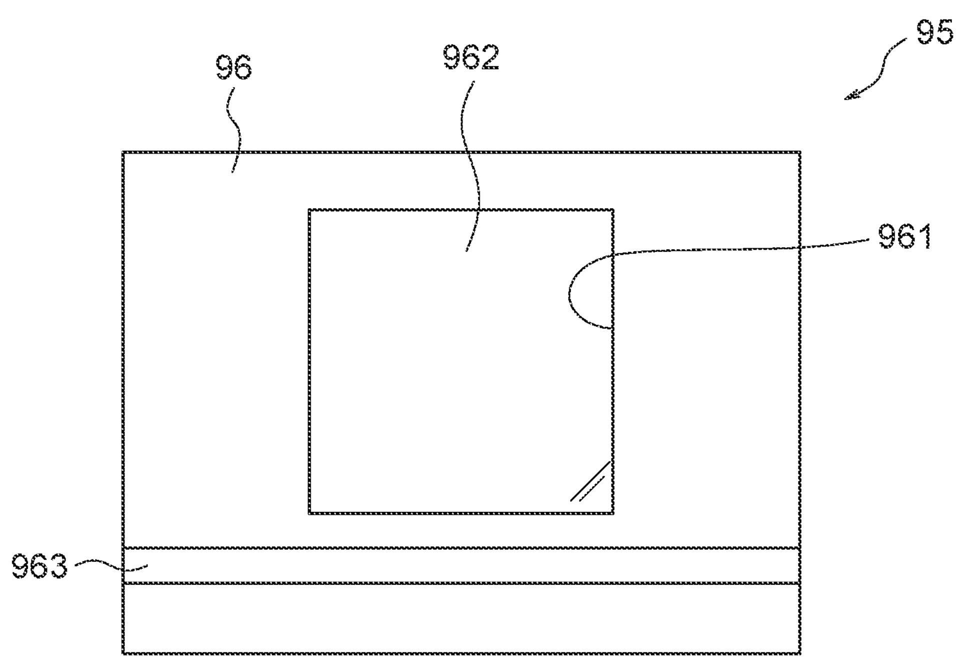
FIG. 15 is a side view showing a socket cover according to the second embodiment of the present invention and is a view of the socket cover along the XV direction of FIG. 12.
Figure 16:
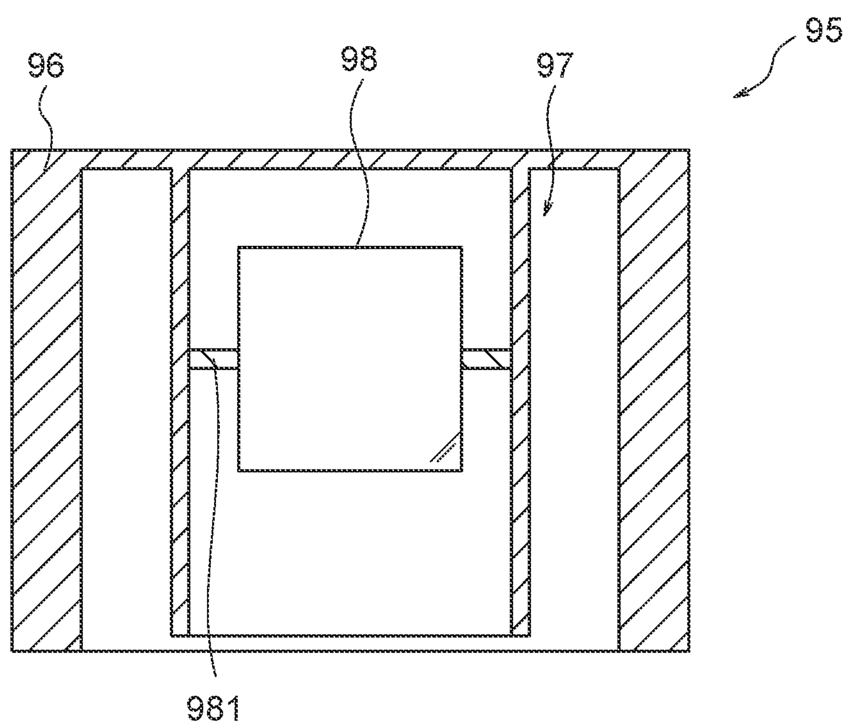
FIG. 16 is a sectional view showing a socket cover in the second embodiment of the present invention, a view taken along XVI-XVI of FIG. 12.

FIG. 12 is a schematic cross-sectional view showing the overall configuration of the electronic component testing apparatus in the present embodiment. FIG. 13 and FIG. 14 are enlarged sectional views each corresponding to XIII portion of FIG. 12, FIG. 13 is a diagram showing the DUT 10 prior to pressed against the socket 90B, FIG. 14 is a diagram showing a state of pressing the DUT 10 against the socket 90B. FIG. 15 is a side view showing a socket cover in the present embodiment, a view showing the socket cover along the XV direction of FIG. 12, FIG. 16 is a cross-sectional view showing a socket cover in the present embodiment, along XVI-XVI of FIG. 12.

The electronic component testing apparatus 1B in the present embodiment is an apparatus for manually setting a the DUT 10 in the sockets 90B to test a the DUT 10 and is a so-called manual-type testing apparatus. The present embodiment differs from the first embodiment in that the electronic component testing device 1B does not include the handler 2 (the contact arm 71) and in the configuration of the socket 90B, but the other configurations are the same. Hereinafter, only the difference between the electronic component testing apparatus 1B in the second embodiment and the first embodiment will be described, and the same reference numerals are assigned to the same components as those in the first embodiment, and descriptions thereof will be omitted.

The thermostatic chamber 20 of the electronic component testing apparatus 1B in the present embodiment, as shown in FIG. 12, has a door 22. Opening the door 22 allows to manually set the DUT 10 and a socket cover 95 (described later) to a socket body 91B inside the thermostatic chamber 20.

The socket 90B in this embodiment, as shown in FIGS. 13 and 14, includes a socket body 91B, contactors 92, and a socket cover 95 for covering the socket body 91B. The socket body 91B in the present embodiment corresponds to an example of the "socket body," and the socket cover 95 in the present embodiment corresponds to an example of the "socket cover," in this disclosure.

The socket cover 95 is a member for covering the DUT 10 placed on the socket body 91B, during the test of the DUT 10, and has a function of pressing the DUT 10 against the socket body 91B. Further, in the present embodiment, the socket cover 95 changes the traveling direction of the radio wave radiated from the device antenna 12 of the DUT 10 to the direction toward the test antenna 60 provided in the anechoic chamber 50 when testing the DUT 10 and the traveling direction of the radio wave radiated from the test antenna 60 toward the DUT 10. The socket cover 95 includes a body 96 and a pusher 97.

The body 96 is a box covering the socket body 91B and includes an opening 961, a window 962, and a recess 963.

The opening 961, as shown in FIG. 15 has a rectangular shape, formed on the side wall of the body 96. The opening 961, as shown in FIG. 14, is disposed to face the opening of the thermostatic chamber 20 during the test of the DUT 10 with the DUT 10 pressed against the socket body 91B by the socket cover 95. The shape of the opening 961 is not particularly limited to a rectangular and may be a circle or a triangle.

As shown in FIG. 15, the window 962 is disposed to be fitted into the opening 961. The window 962 is capable of transmitting radio waves and transmits radio waves radiated from the device antenna 12 of the DUT 10 toward the test antenna 60 in the anechoic chamber 50 when testing the DUT 10. The window 962 is made of a resin material capable of transmitting a radio wave radiated from the device antenna 12 and the test antenna 60, including tempered glass and a PEEK material. The opening 961 is closed by the window member 962 in an airtight manner.

As shown in FIGS. 14 and 15, the recess 963 is formed in the outer surface of the body 96. The recess 963 is formed to engage the latch 94 of the socket body 91B (described later).

The pusher 97 has a square tubular shape and is mounted to the body 96 so that the upper end of the pusher 97 contacts the lower surface of the body 96. The pusher 97 includes an opening 971 formed in the side wall and a window 972 fitted into the opening 971. The lower end 97*a* of the pusher 97 is open and the opening of the lower end 97*a* has a size enough to surround the device antenna 12 of the DUT 10.

The opening 971 has a rectangular shape and is formed on the side wall of the pusher 97. The opening 971 is disposed to face the opening 961. The shape of the opening 971 is not particularly limited to a rectangular and may be a circle or a triangle.

The window 972 is disposed to be fitted into the opening 971. The window 972 transmits radio waves radiated from the DUT 10 device antenna 12 toward the test antenna 60 in the anechoic chamber 50 and transmits radio waves radiated from the test antenna 60 toward the device antenna 12 during the DUT 10 testing, similar to the window member 962. As a material constituting the window 972, the same material as that constituting the window 962 can be used. The opening 971 is closed by the window 972 in an airtight manner.

The reflector 98, as shown in FIGS. 14 and 16, is a rectangular flat plate-shaped reflecting plate made of metal and is provided inside the cylindrical pusher 82. Specifically, the reflector 83 is fixed to the inner wall of the pusher by the pin 981 penetrating the reflector 98 in the width direction. The reflector 98 is disposed on the pusher 82 to face the DUT 10 on the normal of the mounting surface 93 of the socket body 91B when the pusher contacts the DUT 10. That is, the reflector 98 is disposed to position right above the device antenna 12 of the DUT 10 when the pusher 97 contacts the DUT 10. The reflector 98 changes the traveling direction of the radio wave radiated from the device antenna 12 of the DUT 10 toward the test antenna 60 provided in the anechoic chamber 50 and the traveling direction of the radio wave radiated from the test antenna 60 to the device antenna 12 (see FIG. 14) when testing the DUT 10.

The reflector 98 is inclined with respect to the mounting surface 93 of the DUT 10 in the socket body 91B provided in the test head 32. The inclination angle of the reflector 98 with respect to the mounting surface 93 is set to change the traveling direction of the radio waves radiated from the device antenna 12 toward the test antenna 60 and the traveling direction of the radio waves radiated from the test antenna 60 device antenna toward the device antenna 12 when testing the DUT 10. As an example, the angle of inclination of the reflector 83 with respect to the mounting surface 93 is 45°. Providing such a reflector 83 inside the socket cover 95 allows to place the anechoic chamber 50 on the side of the thermostatic chamber 20.

The reflector 98 is not particularly limited to rectangular shape and may be a circular shape or a triangular shape. The reflector 98 is not particularly limited to a flat plate, for example, may be the recessed spherical central portion.

The socket body 91B, in that it has a latch 94 is different from the socket body 91 in the first embodiment. The latch 94 is attached to the upper portion of the socket body 91B and protrudes upward. The latch 94, as shown in FIG. 14, has a shape that engages with the recess 963 of the socket cover 95. The latch 94 engaging with the recess 963 fixes the socket cover 95 to the socket body 91B and causes the pusher 97 to press the DUT 10 against the socket body 91B.

Referring to FIGS. 13 and 14, the OTA test of the DUT 10 performed by the electronic component testing apparatus 1B according to the present embodiment will be described below.

First, as shown in FIG. 13, the DUT 10 is placed on the mounting surface 93 of the socket body 91B to contact the input and output terminals 14 of the DUT 10 with the contactors 92 of the socket body 91B.

As shown in FIG. 13, the socket cover 95 is lowered toward the DUT 10 from right above the DUT 10. As shown in FIG. 14, the socket cover 95 is fixed to the socket body 91B by engaging the latch 94 with the recess 963 of the socket cover 95. This causes the lower end 97*a* of the pusher 97 to contact the DUT 10 to surround the device antenna 12 and presses the DUT 10 against the socket body 91B.

Fixing socket cover 95 to the socket body 91B causes the opening 961 of the pusher 97 to face the opening 21 of the thermostatic chamber 20. Thus, the reflector 98, the opening 971, openings 961, 21, 53, and the test antenna 60 is arranged side by side on the same straight line.

While pressing the DUT 10 against the socket body 91B, the thermostatic chamber 20 adjusts the temperature to a predetermined temperature and the dry air supply device 72 starts to supply dry air to the space 43. Then, the following the DUT 10 test determines the characteristics of the radio wave radiation and reception.

Specifically, first, the test signals outputted from the main frame 31 are transmitted to the DUT 10 via the contactors 92 of the socket 90 mounted on the test head 32. The DUT 10 receiving the test signal, as shown in FIG. 14, radiates radio waves upward from the device antenna 12. The radio wave reaches the reflector 98 and is reflected in the direction of the anechoic chamber 50. The radio wave passes through the window 972, 962, and 40, enters the anechoic chamber 50, and is received by the test antenna 60. The radio wave is converted into an electric signal and transmitted to the main frame 31 via the cable 312. The radio wave radiation characteristic of the DUT 10 is evaluated using the signal.

Then, while keeping the DUT 10 pressed against the socket body 91B, the test signal outputted from the main frame 31 is sent to the test antenna 60 via the cable 312. The test antenna 60 radiates a radio wave toward the opening 53 of the anechoic chamber 50. The radio wave, after passing through the window 40, 962, and 972, reaches the reflector 83 and is reflected toward the DUT 10. The radio wave is received by the device antenna 12 of the DUT 10. The radio wave received is converted into an electric signal and sent to the main frame 31 via the contactors 92 of the socket 90B, the test head 32, and the cable 311. The radio wave reception characteristics of the DUT 10 is evaluated using the signal.

After the evaluation of the DUT 10, the socket cover 95 is removed from the socket body 91B and the DUT 10 is removed from the socket body 91B. This completes the DUT 10 test.

As described above, in the present embodiment, similarly to the first embodiment described above, the thermostatic chamber 20 and the anechoic chamber 50 are connected so that the opening 21 and 53 face each other, the window 40, which is capable of transmitting the radio wave radiated from the device antenna 12 and the test antenna 60, closes the opening 21. This, on the test of the DUT 10 while applying a temperature (high temperature or low temperature) to the DUT 10 in the thermostatic chamber 20, protects the radio wave absorber 52 in the anechoic chamber 50 from thermal stress and reduce the damage of the radio wave absorber 52. This allows to perform the OTA test of the DUT 10 with high accuracy.

In the present embodiment, the socket 90B includes the socket cover 95 having a reflector 98. The reflector 98 of the socket cover 95 enables to convert the traveling direction of the radio wave radiated from the device antenna 12 in toward the test antenna 60 in the anechoic chamber 50 when testing the DUT 10. This allows to place the anechoic chamber 50 to the side of the thermostatic chamber 20 and to provide an electronic component testing apparatus easy to do maintenance work of the anechoic chamber.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, in the embodiments above, the electronic component testing apparatus tests both the radio wave radiation characteristic and the radio wave reception characteristic of the DUT, but the embodiments are not particularly limited thereto. For example, the electronic component testing apparatus may test only one of the radio wave radiation characteristics or the radio wave reception characteristic of the DUT.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1,1B . . . Electronic component testing apparatus
2 . . . Handler
20 . . . Thermostatic chamber
21 . . . Opening
40 . . . Window
41 . . . Plate-shaped members
42 . . . Space
50 . . . Anechoic chamber
51 . . . Shield box
52 . . . Radio wave absorber
53 . . . Opening
60 . . . Test antenna
71 . . . Contact arm
72 . . . Dry air supply unit
721 . . . Supply port
722 . . . Supply piping
73 . . . Heater
80 . . . Contact chuck
81 . . . Body
811 . . . Suction piping
82 . . . Pusher
821 . . . Opening
822 . . . Window
83 . . . Reflector
831 . . . Pins
84 . . . Vacuum pump
3 . . . Tester
31 . . . Main frame
311,312 . . . Cable
32 . . . Test head
90,90B . . . Socket
91, 91B . . . Socket body
92 . . . Contactors
93 . . . Mounting surface
94 . . . Latch
95 . . . Socket cover
96 . . . Body
961 . . . Opening
962 . . . Window
963 . . . Recess
97 . . . Pusher
971 . . . Opening
972 . . . Window
98 . . . Reflector
981 . . . Pins
10 . . . DUT
11 . . . Substrate
12 . . . Device antenna
13 . . . Semiconductor chip
14 . . . Input and output terminals

What is claimed is:

1. An electronic component handling apparatus comprising:

a thermostatic chamber in which a socket is disposed, wherein the socket is electrically connectable to a device under test (DUT) comprising a first antenna;

a moving device that moves the DUT and presses the DUT against the socket;

an anechoic chamber disposed adjacent to the thermostatic chamber;

a second antenna disposed inside the anechoic chamber; and a first window that transmits radio waves radiated from the first or second antenna, wherein the thermostatic chamber has a first opening on a wall surface of the thermostatic chamber, the anechoic chamber has:

a radio wave absorber, and a second opening that opens toward a transmission direction of the radio waves from or to the second antenna, and the thermostatic chamber and the anechoic chamber are connected to each other to make the first opening and the second opening face each other.

2. The electronic component handling apparatus according to claim 1, wherein the first window comprises:

a pair of plates that transmits the radio waves radiated from the first or second antenna; and a spacer that is interposed between the plates and determines a space between the plates, and the electronic component handling apparatus further comprises:

a supply device that supplies dry air to the space.

3. The electronic component handling apparatus according to claim 2, further comprising:

a heater that heats one of the plates that is disposed closer to the anechoic chamber.

4. The electronic component handling apparatus according to claim 1, wherein the moving device comprises a holder that holds the DUT, the holder comprises a reflector that reflects radio waves radiated from the first and second antennas, and the reflector is inclined with respect to a main surface of the socket.

5. The electronic component handling apparatus according to claim 4, wherein the reflector is disposed in the holder and faces the first antenna in a normal direction of the main surface of the socket.

6. The electronic component handling apparatus according to claim 4, wherein the holder further comprises:

a pusher that touches the DUT and holds the reflector.

7. The electronic component handling apparatus according to claim 4, wherein the holder further comprises:

a cylindrical pusher that touches the DUT and surrounds the first antenna; and a suction device that sucks a space in the pusher; and the pusher has a third opening in a side wall of the pusher and a second window that transmits the radio waves radiated from the first or second antenna, wherein the second window closes the third opening, and the reflector is disposed inside the pusher and faces the second window.

8. The electronic component handling apparatus according to claim 1, further comprising:

a plurality of radio wave anechoic chambers; and a plurality of first windows, wherein the thermostatic chamber has a plurality of first openings, the thermostatic chamber and the radio wave anechoic chambers are connected to make each of the first openings face the corresponding second opening of each of the anechoic chambers, and the first windows respectively close the first openings.

9. The electronic component handling apparatus according to claim 8, wherein the following equation (1) is satisfied:

$$W_1 \geq W_2 \quad (1)$$

where:

$W_1$ is the width of the first opening, and $W_2$ is the spread width, in a width direction of the first opening, of the radio wave when the radio wave, radiated from the first antenna and reflected by the reflector, reaches the first opening.

10. An electronic component testing apparatus comprising:

an electronic component handling apparatus according to claim 1; and a tester comprising:

a test head to which the socket is mounted, wherein the tester tests the DUT by transmitting and receiving radio waves between the first and second antennas while the DUT is electrically connected to the socket and the tester is electrically connected to the second antenna.

11. An electronic component testing apparatus comprising:

a socket to which a device under test (DUT) comprising a first antenna is electrically connected;

a tester comprising a test head on which the socket is mounted;

a thermostatic chamber in which the socket is disposed;

an anechoic chamber disposed adjacent to the thermostatic chamber;

a second antenna disposed inside the anechoic chamber; and a first window that transmits radio waves radiated from the first or second antenna, wherein the thermostatic chamber has a first opening on a wall surface of the thermostatic chamber, the anechoic chamber has:

a radio wave absorber disposed on an inner wall of the anechoic chamber; and a second opening that opens toward a transmission direction of the radio waves from or to the second antenna, wherein, the thermostatic chamber and the anechoic chamber are connected to each other to make the first opening and the second opening face each other, the first window closes the first opening, the socket comprises:

a socket body that holds a contactor electrically connected to the DUT; and a socket cover that covers the socket body and presses the DUT against the socket body, the socket cover has a reflector that reflects the radio waves radiated from the first or second antenna, the reflector is inclined with respect to a main surface of the socket body, the tester tests the DUT by transmitting and receiving radio waves between the first and second antennas while the DUT is electrically connected to the socket and the tester is electrically connected to the second antenna.

12. The electronic component testing apparatus according to claim 11, wherein the first window comprises:

a pair of plates that transmits the radio waves radiated from the first or second antenna; and a spacer that is interposed between the plates and determines a space between the plates, and the electronic component testing apparatus further comprises:

a supply device that supplies dry air to the space.

13. The electronic component testing apparatus according to claim 11, further comprising:

a heater that heats one of the plates that is disposed closer to the anechoic chamber.

14. A socket comprising:

a socket body that holds a contactor electrically connected to the DUT comprising a first antenna; and a socket cover that covers the socket body and presses the DUT against the socket body, wherein the socket cover has a reflector that reflects radio waves radiated from the first antenna, and the reflector is inclined with respect to a main surface of the socket body.

15. The socket according to claim 14, wherein the reflector is disposed on the socket cover and faces the first antenna in a normal direction of the main surface.

16. The socket according to claim 14, wherein the socket cover comprises:

a pusher that touches the DUT mounted on the socket body and holds the reflector.

* * * * *